United States Patent
Shintate et al.

(10) Patent No.: US 7,416,759 B2
(45) Date of Patent: Aug. 26, 2008

(54) WIRING PATTERN FORMATION METHOD, WIRING PATTERN, AND ELECTRONIC DEVICE

(75) Inventors: Tsuyoshi Shintate, Matsuyama-machi (JP); Kazuaki Sakurada, Suwa (JP); Noboru Uehara, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 11/223,921

(22) Filed: Sep. 13, 2005

(65) Prior Publication Data

US 2006/0068616 A1    Mar. 30, 2006

(30) Foreign Application Priority Data

| Sep. 28, 2004 | (JP) | ............................. 2004-282219 |
| Sep. 28, 2004 | (JP) | ............................. 2004-282223 |
| Oct. 29, 2004 | (JP) | ............................. 2004-317084 |
| Jun. 29, 2005 | (JP) | ............................. 2005-190101 |

(51) Int. Cl.
*H05K 3/00* (2006.01)

(52) U.S. Cl. ...................................... 427/97.1; 29/846

(58) Field of Classification Search ................ 361/600; 427/92.4, 469, 97.1–97.6; 29/846, 842, 874; 438/106, 118, 119; 257/E23.069
See application file for complete search history.

(56) References Cited

U.S. PATENT DOCUMENTS

| 5,132,248 | A | * | 7/1992 | Drummond et al. ......... 505/325 |
| 5,650,199 | A | * | 7/1997 | Chang et al. ................. 427/97.2 |
| 5,954,751 | A | * | 9/1999 | Chen et al. ....................... 607/5 |
| 6,101,363 | A | * | 8/2000 | Tomatsu ...................... 399/330 |
| 6,309,535 | B1 | * | 10/2001 | Williams et al. ......... 205/777.5 |
| 6,436,256 | B1 | * | 8/2002 | Williams et al. ........ 204/403.06 |
| 6,493,932 | B1 | * | 12/2002 | Haba ............................ 29/840 |
| 6,790,907 | B2 | * | 9/2004 | Takata et al. ................. 524/833 |
| 6,890,063 | B2 | * | 5/2005 | Kim ............................. 347/56 |
| 2001/0018234 | A1 | * | 8/2001 | Jiang et al. ................... 438/118 |
| 2001/0051392 | A1 | * | 12/2001 | Akram ......................... 438/106 |
| 2004/0000429 | A1 | | 1/2004 | Furusawa et al. |
| 2004/0060162 | A1 | * | 4/2004 | Moren .......................... 29/601 |
| 2004/0094842 | A1 | * | 5/2004 | Jimarez et al. ............... 257/772 |
| 2004/0095441 | A1 | * | 5/2004 | Jeanmaire ..................... 347/82 |
| 2004/0129978 | A1 | * | 7/2004 | Hirai ........................... 257/347 |
| 2004/0145858 | A1 | | 7/2004 | Sakurada |

FOREIGN PATENT DOCUMENTS

| JP | A-2003-309369 | 10/2003 |
| JP | A-2004-186668 | 7/2004 |
| JP | A-2004-228375 | 8/2004 |

* cited by examiner

*Primary Examiner*—Jeremy C Norris
(74) *Attorney, Agent, or Firm*—Oliff & Berridge, PLC

(57) ABSTRACT

In a method of forming a wiring pattern, a plurality of electrical wirings deposited to be multilayered are conductively connected to one another through a conducting post. The method has forming the electrical wiring by discharging a first droplet including a material for forming the electrical wiring, and forming the conducting post by discharging a second droplet including a material for forming the conducting post, wherein a volume of the second droplet is greater than a volume of the first droplet.

9 Claims, 14 Drawing Sheets

| (S) | (PROCESS) | (DEVICE) | (CONDITION) |
|---|---|---|---|
| 1 | SUBSTRATE CLEANING | EXCIMER UV (172nm WAVELENGTH) | 300sec |
| 2 | WRITING OF 0-TH LAYER DIELECTRIC FILM BANK | DROPLET DISCHARGE DEVICE | - |
| 3 | UV CURING OF BANK | UV (365nm WAVELENGTH) | 4sec |
| 4 | WRITING OF 0-TH LAYER DIELECTRIC FILM | DROPLET DISCHARGE DEVICE | - |
| 5 | UV CURING | UV (365nm WAVELENGTH) | 60sec |
| 6 | CONTROLLING OF 1-ST LAYER Ag CONTACT ANGLE | EXCIMER UV (172nm WAVELENGTH) | 15sec |
| 7 | WRITING OF 1-ST LAYER Ag WIRING | DROPLET DISCHARGE DEVICE | - |
| 8 | Ag FIRING | HOT PLATE | 150°C×30min |
| 9 | WRITING OF 1-ST LAYER Ag POST | DROPLET DISCHARGE DEVICE | - |
| 10 | Ag FIRING | HOT PLATE | 150°C×30min |
| 11 | CONTROLLING OF 1-ST LAYER DIELECTRIC FILM CONTACT ANGLE | EXCIMER UV (172nm WAVELENGTH) | 60sec |
| 12 | WRITING OF 1-ST LAYER DIELECTRIC FILM Ag PERIPHERY | DROPLET DISCHARGE DEVICE | - |
| 13 | LYOPHILIC PROCESSING | EXCIMER UV (172nm WAVELENGTH) | 10sec |
| 14 | UV CURING | UV (365nm WAVELENGTH) | 4sec |
| 15 | 1-ST LAYER DIELECTRIC FILM | DROPLET DISCHARGE DEVICE | - |
| 16 | UV CURING | UV (365nm WAVELENGTH) | 60sec |
| | REPEAT S6 TO S16 FOR 2ND AND LATER LAYERS | | |

FIG. 3

| (S) | (PROCESS) | (DEVICE) | (CONDITION) |
|---|---|---|---|
| 1 | SUBSTRATE CLEANING | EXCIMER UV (172nm WAVELENGTH) | 300sec |
| 2 | WRITING OF 0-TH LAYER DIELECTRIC FILM BANK | DROPLET DISCHARGE DEVICE | - |
| 3 | UV CURING OF BANK | UV (365nm WAVELENGTH) | 4sec |
| 4 | WRITING OF 0-TH LAYER DIELECTRIC FILM | DROPLET DISCHARGE DEVICE | - |
| 5 | UV CURING | UV (365nm WAVELENGTH) | 60sec |
| 6 | CONTROLLING OF 1-ST LAYER Ag CONTACT ANGLE | EXCIMER UV (172nm WAVELENGTH) | 15sec |
| 7A | WRITING OF 1-ST LAYER Ag WIRING | DROPLET DISCHARGE DEVICE | - |
| 7B | Ag TENTATIVE DRYING | DRY AIR | - |
| 8A | WRITING OF 1-ST LAYER Ag POST | DROPLET DISCHARGE DEVICE | - |
| 8B | Ag TENTATIVE DRYING | DRY AIR | - |
| 9 | REPEAT S8A, S8B | | |
| 10 | Ag REGULAR FIRING | HOT PLATE | 150°C×30min |
| 11 | CONTROLLING OF 1-ST LAYER DIELECTRIC FILM CONTACT ANGLE | EXCIMER UV (172nm WAVELENGTH) | 60sec |
| 12 | WRITING OF 1-ST LAYER DIELECTRIC FILM Ag PERIPHERY | DROPLET DISCHARGE DEVICE | - |
| 13 | LYOPHILIC PROCESSING | EXCIMER UV (172nm WAVELENGTH) | 10sec |
| 14 | UV CURING | UV (365nm WAVELENGTH) | 4sec |
| 15 | 1-ST LAYER DIELECTRIC FILM | DROPLET DISCHARGE DEVICE | - |
| 16 | UV CURING | UV (365nm WAVELENGTH) | 60sec |
| | REPEAT S6 TO S16 FOR 2ND AND LATER LAYERS | | |

FIG. 6

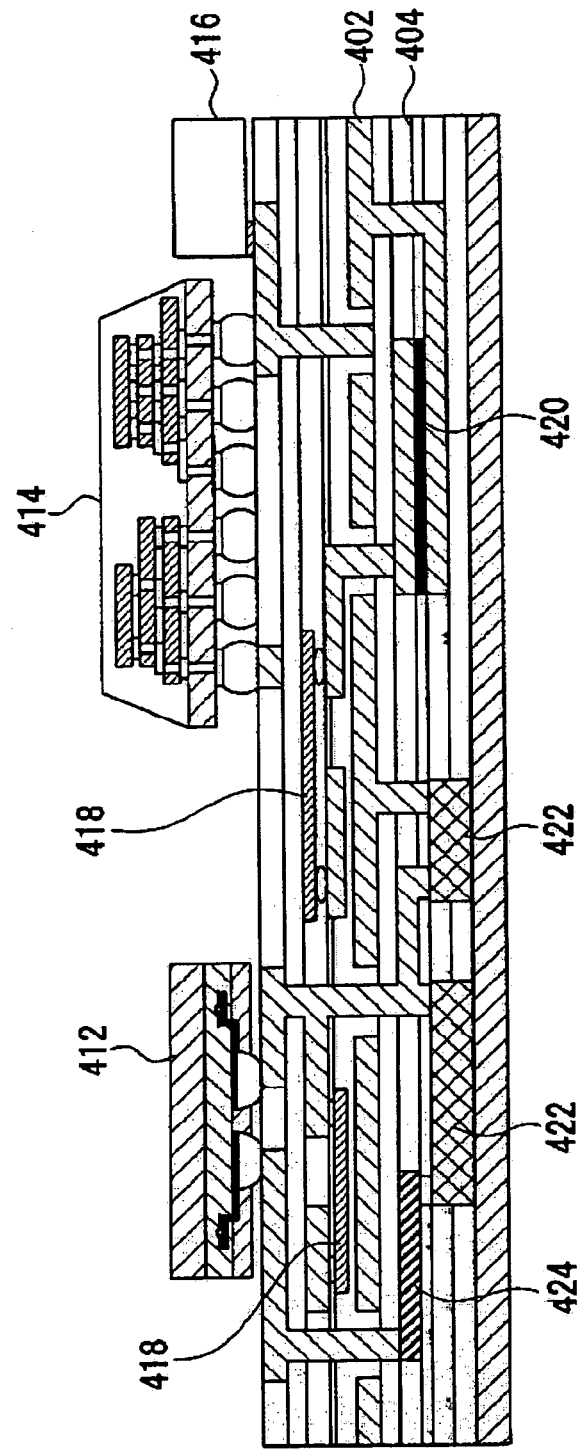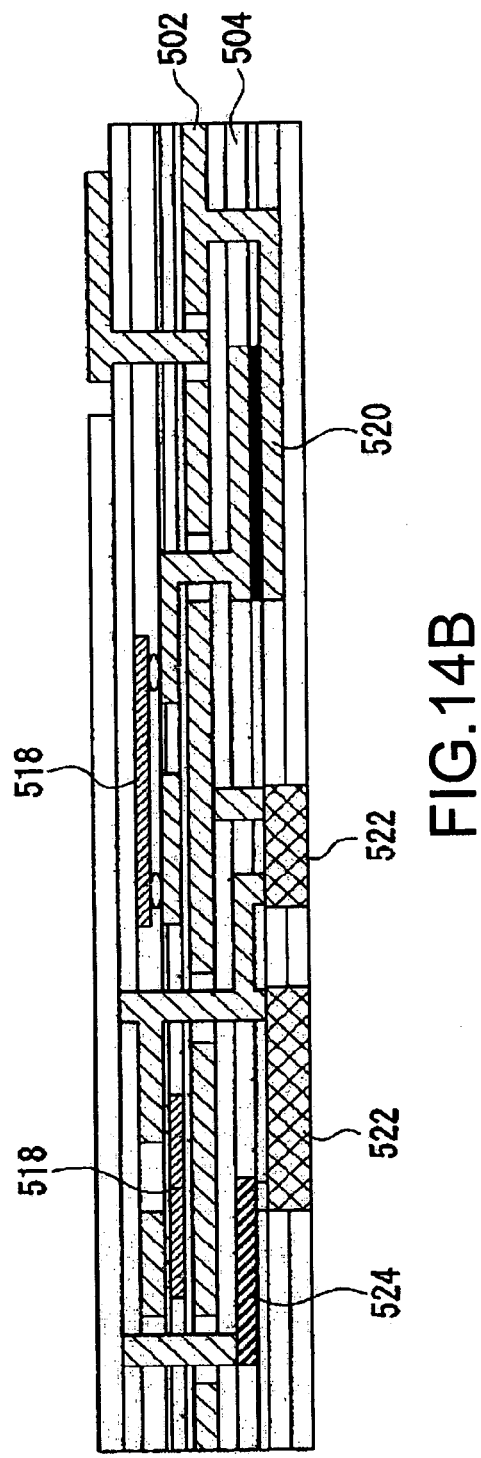
FIG.14A
FIG.14B

WIRING PATTERN FORMATION METHOD, WIRING PATTERN, AND ELECTRONIC DEVICE

This application claims the benefit of Japanese Patent Applications No. 2004-282219 filed Sep. 28, 2004, No. 2004-282223 filed Sep. 28, 2004, No. 2004-317084 filed Oct. 29, 2004 and No. 2005-190101 filed Jun. 29, 2005. The entire disclosure of the prior applications are hereby incorporated by reference herein their entirety.

BACKGROUND OF THE INVENTION

1. Technical Field

The present invention relates to a wiring pattern formation method, a wiring pattern, and an electronic device.

2. Related Art

A lithography technique, for example, is used for formation of a wiring pattern constituting an electronic device. The lithography technique, however, not only requires a large scale facilities such as a vacuum apparatus and complicated processes, but also has several percent efficiency in material use with which almost all materials have to be abolished, resulting in high manufacturing cost. The technique also has a limitation on miniaturization of a wiring pattern.

A method of discharging a liquid containing a functional material to a base material to write and form a wiring pattern directly onto the surface of the substrate (a droplet discharge method) has been discussed as a process replacing the lithography technique. In this method, a liquid with conductive fine particles dispersed is initially discharged from a droplet discharge head to a substrate to write and form a liquid line. The liquid line is then fired by heat treatment or laser irradiation to form an electrical wiring pattern. See, for example, U.S. Pat. No. 5,132,248, an example of related art. By this droplet discharge method, the manufacturing process is simplified and the efficiency in material use is increased. The manufacturing cost can thereby be reduced. The miniaturization of a wiring pattern can also be achieved.

SUMMARY

In order to make electronic devices small-sized, it becomes important that a wiring pattern is miniaturized and multilayered. To implement a multilayered wiring pattern, electrical wirings are deposited to be multilayered with an interlayer dielectric film therebetween and electrical wirings as upper and lower layers are conductively connected to each other through a conducting post. At this point, in order to form a multilayer wiring pattern by utilizing a droplet discharge method, a first droplet is discharged to a position at which an electrical wiring is to be formed to write and form a liquid line, and the liquid line is fired, whereby an electrical wiring is formed. Then, a second droplet is discharged to an end of the electrical wiring to write and form a liquid post, and the liquid post is fired, whereby a conducting post is formed. If the electrical wiring and conducting post are made of the same material, the reliability in electrical connection can improve and the manufacturing cost can be reduced. In this case, the same droplets discharged from the same droplet discharge device can be referred to as a first droplet and a second droplet.

The conducting post, however, must be formed with a substantial height to penetrate the interlayer dielectric film. If the second droplet is made of the same droplet as the first droplet, forming the conducting post requires a long time and forming the conducting post with a substantial height becomes difficult. As a result, there is a problem that making a wiring pattern multilayered becomes difficult. In addition, if the first droplet is made of the same droplet as the second droplet, the electrical wiring is formed to have a wide width, and therefore there is a problem that the miniaturization of a wiring pattern becomes difficult.

An advantage of the invention is to provide a wiring pattern in which a multilayered and miniaturized wiring pattern can be achieved while forming a conducting post with a significant height, and its formation method as well as an electronic device.

On the other hand, the conducting post mentioned above must be formed with a substantial height to penetrate the interlayer dielectric film. For this purpose, it is necessary that a number of droplets be discharged and deposited by a droplet discharge method to form the liquid post with a significant height. However, if a number of droplets are discharged at one time, securing the height of the liquid post is difficult. On the contrary, this might increase the diameter of the liquid post, leading to the short circuit of the liquid post to the adjacent electrical wiring and conducting post. Therefore, to establish a method of forming a conducting post with a significant height by the droplet discharge method is desired.

Furthermore, if a conducting post is fired after an electrical wiring is fired, a crack may occur at the interface therebetween. As a result, a problem arises in that the reliability in electrical connection of the multilayer wiring pattern is reduced.

Another advantage of the invention is to provide a wiring pattern in which the reliability in electrical connection is excellent while forming a conducting post with a significant height, and its formation method as well as an electronic device.

To take advantages mentioned above, a method of forming a wiring pattern according to an aspect of the invention is the method in which a plurality of electrical wirings deposited to be multilayered are conductively connected to one another through a conducting post. The method has a process to form the electrical wiring by discharging a first droplet including a material for forming the electrical wiring, and a process to form the conducting post by discharging a second droplet including a material for forming the conducting post, wherein the volume of the second droplet is greater than the volume of the first droplet.

According to this structure, the second droplet having the large volume is discharged, enabling formation of the conducting post with a significant height for a short time. Accordingly, multilayered wiring patterns can be attained. On the other hand, the first droplet with the small volume is discharged, enabling formation of the electrical wiring with a small width. Accordingly, miniaturization of wiring patterns can be attained.

It is desirable that a second electrical signal voltage that is input to a voltage dependent droplet discharge device so as to discharge the second droplet has a large amount of change of voltage ratio, compared to a first electrical signal that is input to the droplet discharge device to discharge the first droplet.

It is also desirable that a second electrical signal that is input to a droplet discharge device so as to discharge the second droplet have a large absolute value of change ratio, compared to a first electrical signal that is input to the droplet discharge device to discharge the first droplet.

It is also desirable that a second electrical signal that is input to a droplet discharge device so as to discharge the second droplet have a change in voltage pause section of an electrical signal.

These structures enable the volume of the second droplet to be greater than the volume of the first droplet.

To take advantages mentioned above, a method of forming a wiring pattern according to an aspect of the invention is the method in which a plurality of electrical wirings multilayered are conductively connected to one another through a conducting post, the method including to write and form a liquid line by discharging a first droplet including a material for constituting the electrical wiring, to tentatively dry a surface of the liquid line, to write and form a liquid post on the liquid line by discharging a second droplet including a material for constituting the conducting post, and to form the electrical wirings and the conducting post by heating the liquid line and the liquid post.

According to this structure, because the liquid post is written and formed on the surface of the liquid line in the state of being tentatively dried, the liquid post and liquid line can be fused together at the interface. The electrical wiring and the conducting post can be integrally formed by regularly firing the whole of the liquid line and liquid post. Thus, occurrence of a crack at the interface between the electrical wiring and conducting post can be prevented, and as a result, the wiring pattern excellent in reliability of conductive connection.

It is desirable that in the step of forming the liquid post, discharging the second droplet and tentative drying be repeated so that a plurality of liquid subposts are formed to be multilayered, and in the step of heating the liquid post, the plurality of liquid subposts formed to be multilayered be heated so that the conducting post is formed.

According to this structure, because the formation of the liquid subpost by droplet discharge and the tentative drying are repeated, the liquid subposts can be deposited to be multilayered without the spread of the discharged droplet in a wet state on a plane surface. A conducting post with a substantial height can be formed by regularly firing the whole of the liquid subposts deposited to be multilayered in the tentatively dried state.

It is also desirable that the tentative drying be performed by blowing a gas.

It is also desirable that the tentative drying is performed by radiating an infrared ray.

These structures enable tentative drying with the simple manufacturing facilities and manufacturing processes, making it possible to control the rise of facilities cost and manufacturing cost. The temperature can be immediately returned to the normal temperature even if the temperature rises temporarily due to tentative drying, enabling the reduction of manufacturing time.

On the other hand, a wiring pattern according to an aspect of the invention is manufactured by using the wiring pattern formation method described above.

This structure enables a wiring pattern excellent in reliability of electrical connection to be provided. Because the droplet discharge method is employed, a multilayered and miniaturized wiring pattern can be provided.

On the other hand, an electronic device according to an aspect of the invention includes the wiring pattern described above.

According to this structure, the electronic device includes miniaturized and multilayered wiring pattern excellent in reliability of electrical connection, and therefore a small-sized electronic device excellent in reliability of electrical connection can be provided.

BRIEF DESCRIPTION OF THE DRAWINGS

The invention will be described with reference to the accompanying drawings, wherein like numerals refer to like elements, and wherein:

FIG. 3 is a process table of a wiring pattern formation method according to a first embodiment;

FIG. 6 is a process table of a wiring pattern formation method according to a second embodiment;

FIGS. 14A and 14B are sectional side views of a very high density module;

DESCRIPTION OF THE EMBODIMENTS

Figure 1:
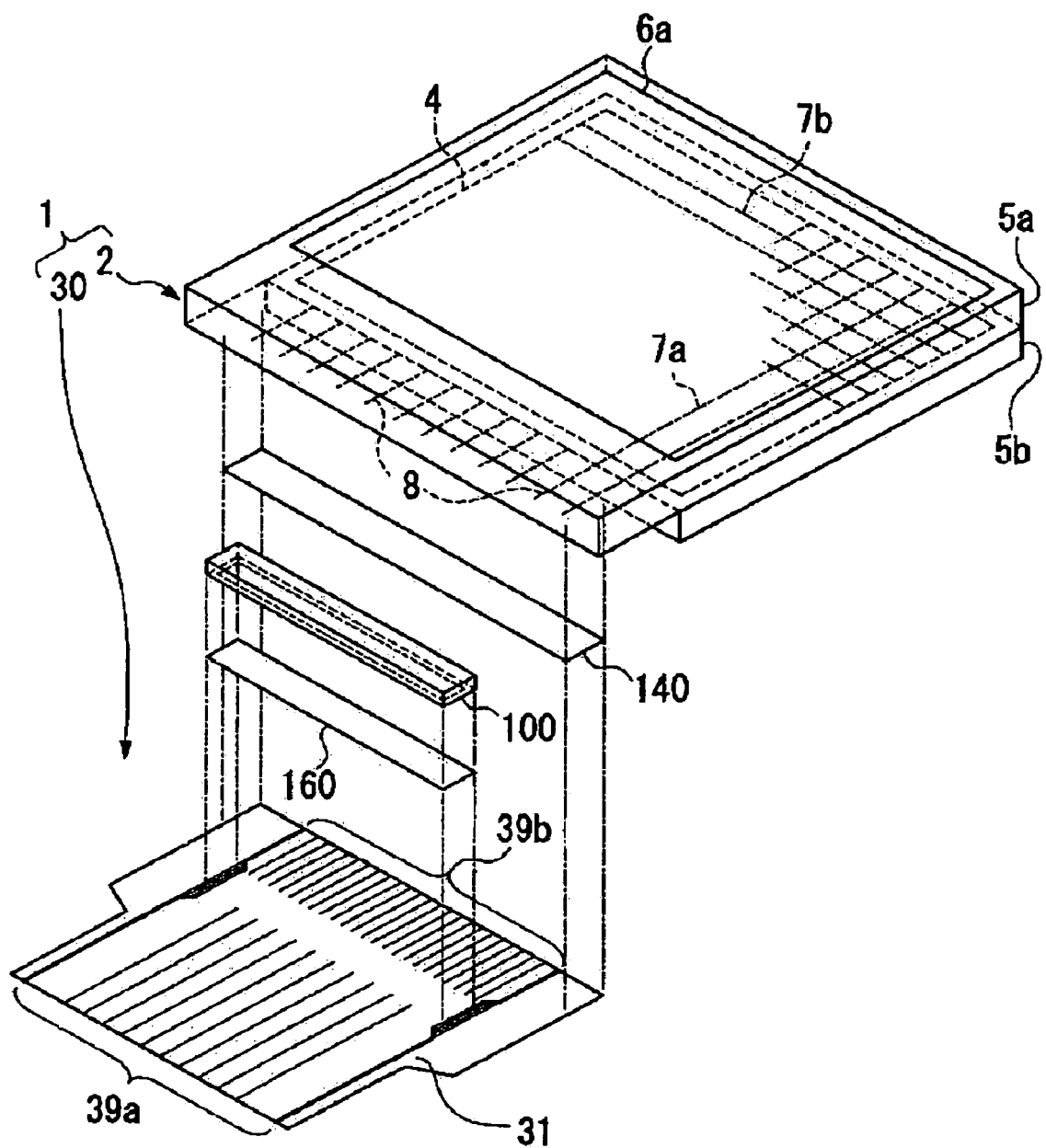
FIG. 1 is an exploded perspective view of a liquid crystal module with the structure of COF.

Embodiments of the invention will now be described with reference to the accompanying drawings. In the drawings that will be used for the following description, scales of members are changed suitably so as to make them recognizable.

First Embodiment

FIG. 1 is an exploded perspective view of a liquid crystal module with the structure of chip on film (COF). In the present embodiment, a wiring pattern formation method on a flexible printed circuit board (hereinafter, referred to as a FPC) 30 is taken as an example and described. The FPC 30 has electrical wiring patterns 39a and 39b formed on the surface of a film substrate 31 having flexibility. Although the details will be described later, in a liquid crystal module 1 shown in FIG. 1, the FPC 30 is connected to an end of the liquid crystal panel 2 and a liquid crystal drive IC 100 is mounted on the surface of the FPC 30. From this liquid crystal drive IC 100, a drive signal is output through the FPC 30 to the liquid crystal panel 2, thereby displaying an image on the liquid crystal panel 2.

[Wiring Pattern]

Figure 2A:
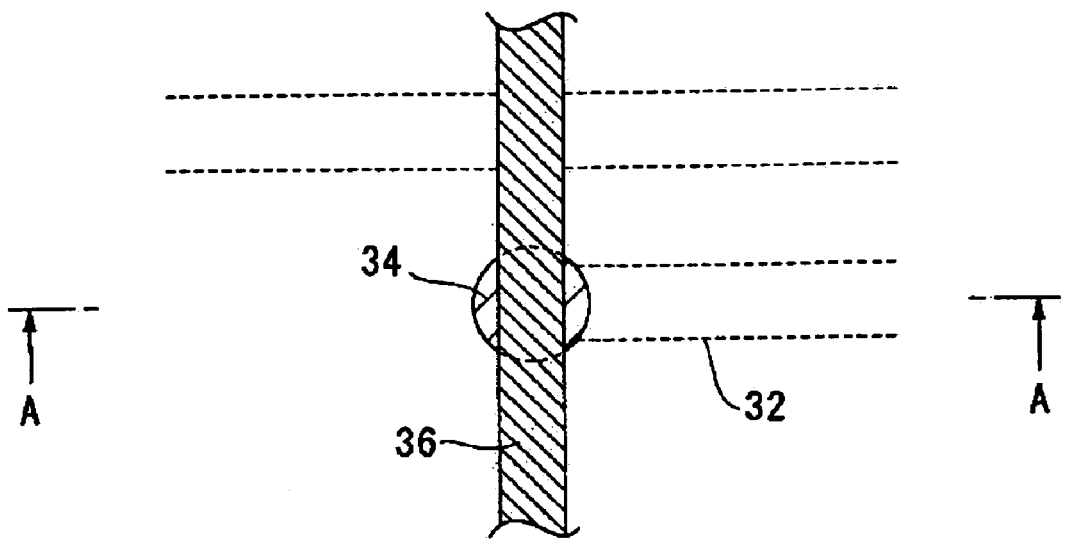
FIGS. 2A and 2B are explanatory views of a wiring pattern according to an embodiment.
Figure 2B:
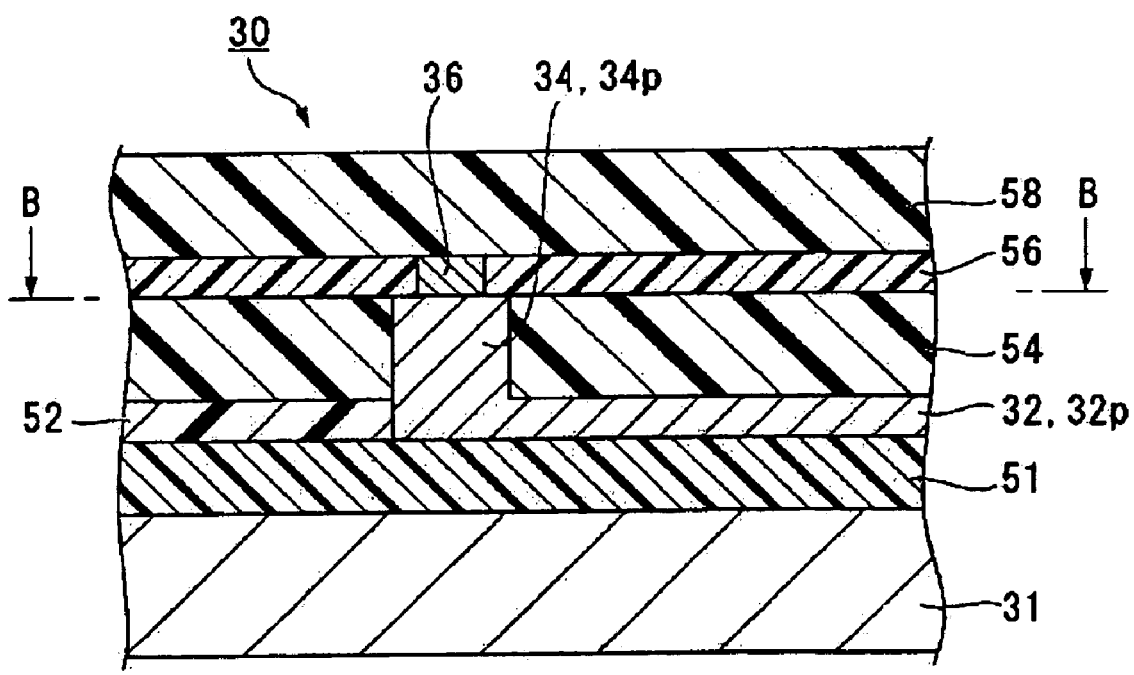

FIGS. 2A and 2B are explanatory views of a wiring pattern according to the present embodiment and enlarged views of a portion in which the wiring of the FPC is formed. FIG. 2A is a plane sectional view taken along the line B-B in FIG. 2B; FIG. 2B is a side sectional view taken along the line A-A in FIG. 2A. As shown in FIG. 2B, the wiring pattern of the embodiment is structured such that an electrical wiring 32 as a lower layer (lower layer electrical wiring 32) and an electrical wiring 36 as an upper layer (upper layer electrical wiring 36) are deposited with an interlayer dielectric film 54 therebetween and are conductively connected through a conducting post 34. Incidentally, the wiring pattern described below is just an example, and an embodiment of the invention may be applied to other wiring patterns.

As shown in FIG. 2B, the FPC 30 includes the film substrate 31 with flexibility, which is formed of polyimide, etc. A substrate dielectric film 51 is formed on the surface of the film substrate 31. The substrate dielectric film 51 is formed of a dielectric material having a UV curable resin such as acryl as a main component. The substrate dielectric film 51 may also be formed of a dielectric material, which is a mixture of a UV curable resin such as acryl and a thermosetting resin such as epoxy.

A plurality of electrical wirings 32 are formed on the surface of the substrate dielectric film 51. The electrical wiring 32 is formed of a conductive material such as Ag in a predetermined pattern. An intra-layer dielectric film 52 is formed in an area in which the electrical wiring 32 is not formed on the surface of the substrate dielectric film 51. The line width and space width of the electrical wiring 32 are miniaturized to, for example, about 30 µm and about 30 µm, respectively, due to employment of the droplet discharge method described later.

The interlayer dielectric film 54 is formed to mainly cover the electrical wiring 32. The interlayer dielectric film 54 is formed of the same resin material as used for the substrate dielectric film 51. A conducting post 34 having a substantial height is formed extending upwards from part of the electrical wiring 32 so as to penetrate the interlayer dielectric film 54. The conducting post 34 is cylindrically formed of the same conductive material, e.g. Ag, as used for the electrical wiring 32. As an example, the thickness of the electrical wiring 32 is around 2 µm and the height of the conducting post 34 is formed to be around 8 µm.

On the surface of the interlayer dielectric film 54, the upper layer electrical wiring 36 is formed. The upper layer electrical wiring 36 is formed of a conductive material such as Ag as same as used for the lower electrical wiring 32. As shown in FIG. 2A, the upper layer electrical wiring 36 may be disposed to intersect the lower electrical wiring 32. The upper layer electrical wiring 36 is connected to the upper end of the conducting post 34 to secure conductivity with the lower layer electrical wiring 32.

As shown in FIG. 2B, an intra-layer dielectric film 56 is also formed in an area in which the electrical wiring 36 is not formed on the surface of the intra-layer dielectric film 54. A protective film 58 is further formed to mainly cover the electrical wiring 36. These intra-layer dielectric film 56 and protective film 58 are formed of the same resin material as used for the substrate dielectric film 51.

The wiring pattern including two layer electrical wirings 32 and 36 is taken as an example and described above, and the wiring pattern including electrical wirings equal to or more than three layers is possible. In this case, it is sufficient that just as the structure ranging from the first layer electrical wiring 32 to the second layer electrical wiring 36, the n-th layer electrical wiring to the n+1-th layer electrical wiring are formed.

[Wiring Pattern Formation Method]

The wiring pattern formation method according to the first embodiment will next be described.

FIG. 3 is a process table of the wiring pattern formation method according to the first embodiment. The processes will now be described with reference to FIG. 2B in the order of step numbers in the leftmost column of FIG. 3.

Initially, the surface of the film substrate 31 shown in FIG. 2B is cleaned (step 1). Specifically, an excimer UV laser beam at a wavelength of 172 nm is applied to the surface of the film substrate 31 for around 300 seconds. The film substrate 31 may be cleaned with a solvent such as water, and may also be cleaned by using ultrasonic wave. A plasma beam may be applied at the normal pressure to the film substrate 31 to clean it.

As a precondition to forming the substrate dielectric film 51 onto the surface of the film substrate 31, a bank (a peripheral edge) of the substrate dielectric film 51 is then written and formed (step 2). This writing is performed by a droplet discharge method (an ink jet printing technique). Namely, a resin material before being cured, which is a formation material of the substrate dielectric film 51, is discharged along the peripheral edge of the area in which the substrate dielectric film 51 is formed, by using the droplet discharge device described later.

Then the discharged resin material is cured (step 3). Specifically, the UV curable resin, which is a material for forming the substrate dielectric film 51, is irradiated with a UV beam at a wavelength of 365 nm for 4 seconds to be cured. A bank is thereby formed on the peripheral edge of the area in which the substrate dielectric film 51 is formed.

The substrate dielectric film 51 is written and formed inside the bank formed (step 4). This writing is also performed by the droplet discharge method. Specifically, the method discharges a resin material before being cured, which is a material for forming the substrate dielectric film 51, from a droplet discharge head of the droplet discharge device described later, while having the droplet discharge head scan the entire inside of the bank. If the discharged resin material flows, it is interrupted by the bank of the peripheral edge, and therefore will not spread over the area in which the substrate dielectric film 51 is formed.

Then the discharged resin material is cured (step 5). Specifically, the UV curable resin, which is a material for forming the substrate dielectric film 51, is irradiated with a UV beam at a wavelength of 365 nm for around 60 seconds to be cured. The substrate dielectric film 51 is thereby formed on the surface of the film substrate 31.

As a precondition to forming the electrical wiring 32 on the surface of the substrate dielectric film 51, the contact angle of the surface of the substrate dielectric film 51 is controlled (step 6). As will be described in the following, in the case of discharging a droplet containing a material for forming the electrical wiring 32, if a contact angle to the surface of the substrate dielectric film 51 is too large, the discharged droplet has a ball-like shape. As a result, it becomes difficult to form the electrical wiring in a predetermined shape at a predetermined position. On the other hand, if the contact angle to the surface of the substrate dielectric film 51 is too small, the discharged droplet spreads in a wet state, making it difficult to miniaturize the electrical wiring. Because the surface of the cured substrate dielectric film 51 exhibits lyophobicity, the contact angle of the surface of the substrate dielectric film 51 is controlled by applying an excimer UV laser beam at a wavelength of 172 nm to the surface for around 15 seconds. The extent to which the lyophobicity is relaxed can be adjusted by ultraviolet irradiation time, and may be adjusted by the combination of the intensity of ultraviolet radiation, wavelength, and the heat treatment (heating). As other lyophilic processing methods, the plasma processing using oxygen as a reactive gas and the processing of exposing a substrate to an ozone atmosphere are mentioned.

A liquid line 32p that will later be an electrical wiring is written and formed on the surface of the substrate dielectric film 51 (step 7). This writing is performed by the droplet discharge method using the droplet discharge device described later. What is discharged in this step is a dispersion liquid in which conductive fine particles, which are a material for forming the electrical wiring, are dispersed in the dispersion medium. Silver is preferably used as the conductive fine particles. Besides, metal fine particles containing any one of gold, copper, palladium, and nickel, and fine particles of conductive polymer and superconductor may be used.

The conductive fine particles having the surface coated with an organic matter may be used in order to improve its dispersibility. As coating materials used for coating the surface of conductive fine particles, polymers to induce steric hindrance or electrostatic repulsion are mentioned. It is preferable that the particle size of the conductive fine particles be not less than 5 nm nor greater than 0.1 μm. If the particle size is greater than 0.1 μm, the nozzle tends to be clogged, and thus the discharge with a droplet discharge head becomes difficult. If the particle size is less than 5 nm, the volume ratio of a coating agent to conductive fine particles increases, and therefore the ratio of the organic matter in the conductive material obtained becomes excessive.

The dispersion medium used must be one by which the above conductive fine particles can be dispersed and cohesion is not caused, and there is no other particular restriction on the dispersion medium used. Alcohol such as methanol, ethanol, propanol, and butanol; hydrocarbon compounds such as n-heptane, n-octane, decane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis(2-methoxyethyl)ether, and p-dioxane; and polar compounds such as propylene carbonate, γ-butyrolactone, N-methyl-2-pyrrolidone, dimethylformamide, dimethylsulfoxide, and cyclohexanone; other than water, may be mentioned as the dispersion medium used. Among them, water, alcohol, hydrocarbon compounds, and ether compounds are preferable in regard to the dispersibility of fine particles and the stability of the dispersion liquid, as well as the ease of their application to the droplet discharge method; water and hydrocarbon compounds may be mentioned as the particularly preferable dispersion media. These dispersion media may be used independently or as a mixture of two or more types.

It is preferable that the dispersion medium of the liquid containing conductive fine particles have a vapor pressure not less than 0.001 mmHg nor more than 200 mmHg (approximately not less than 0.133 Pa nor more than 26600 Pa) at room temperature. If the vapor pressure exceeds 200 mmHg, the dispersion medium evaporates rapidly after discharge, making it difficult to form a good conductive material. It is further preferable that the dispersion medium have a vapor pressure not less than 0.001 mmHg nor more than 50 mmHg (approximately not less than 0.133 Pa nor more than 6650 Pa). If the vapor pressure exceeds 50 mmHg, nozzle clogging due to drying is easy to occur when a droplet is discharged by the droplet discharge method, making the stable discharge difficult. On the other hand, if the dispersion medium has a vapor pressure less than 0.001 mmHg at room temperature, drying is delayed and the dispersion medium is likely to remain in the conductive material, making it difficult to obtain a high-quality conductive material after heat and/or optical processing in the later process.

The dispersoid density in which the above conductive fine particles disperse in the dispersion medium is not less than 1 mass % nor more than 80 mass %, which can be adjusted depending on a desired thickness of the conductive material. If the dispersoid density exceeds 80 mass %, cohesion is likely to occur, making it difficult to obtain a uniform conductive material.

It is preferable that the surface tension of the dispersion liquid containing the above conductive fine particles is in the range not less than 0.02 N/m nor more than 0.07 N/m. If the surface tension is under 0.02 N/m when a liquid is discharged by the droplet discharge method, the wettability of an ink composition to the nozzle surface increases and therefore the deflection is likely to occur, while if the wettability exceeds 0.07 N/m, the shape of meniscus at the tip of the nozzle is not stable and therefore it is difficult to control the discharge amount and discharge timing.

A minute amount of fluorine-based, silicon-based, or non-ion-based surface tension adjusting agent can be added to the dispersion liquid mentioned above in order to adjust its surface tension unless the contact angle to the substrate dielectric film 51 is unduly reduced. The nonion-based surface tension adjusting agent makes the wettability to the substrate dielectric film 51 good, improves the leveling of the film, and helps prevent the roughness and orange peel of a coating film. It is safe that the dispersion liquid mentioned above includes alcohol, ether, ester, ketone, and other organic compounds if necessary.

It is preferable that the dispersion liquid mentioned above have the viscosity not less than 1 mPa·s nor more than 50 mPa·s. If the viscosity is less than 1 mPa·s when the liquid is discharged by the droplet discharge method, the periphery of the nozzle tends to be contaminated due to the outflow of ink, while if the viscosity is more than 50 mPa·s, the frequency of clogging in a nozzle hole increases, making it difficult to smoothly discharge a droplet.

In the embodiment, a droplet of the dispersion liquid mentioned above (a first droplet) is discharged from a droplet discharge head and dropped to a location where an electrical wiring is to be formed. At this point, adjusting the overlap of droplets discharged consecutively is desirable to prevent the creation of a bulge. In particular, the discharge method in which a plurality of droplets are discharged separately so as to be not in contact with one another at a first discharge and the spaces are filled up at the subsequent discharges is desirable.

Thus, the liquid line 32$p$ is formed on the surface of the substrate dielectric film 51.

The liquid line 32$p$ is then fared (step 8). Specifically, the film substrate 31 on which the liquid line 32$p$ is formed is heated on a hot plate at 150 degree Celsius for around 30 minutes. This firing process is normally performed in the atmosphere, and may be performed in an inert gas atmosphere such as nitrogen, argon, and helium as the need arises. The processing temperature of the heat treatment was set to be 150 degree Celsius in this case, but it is desirable to suitably set the temperature in consideration of the boiling point (steam pressure) of the dispersion medium included in the liquid line 32$p$, the type and pressure of an atmosphere gas, thermal behaviors such as dispersibility and oxidation of fine particles, the presence or absence and the quantity of a coating material, the upper temperature limit of a base material, etc.

The firing process in this manner may be performed by lamp annealing other than the typical processing by use of a hot plate, an electric furnace, etc. There is no particular restriction on the light source used for lamp annealing; an infrared lamp, a xenon lamp, a YAG laser, an argon laser, a carbon dioxide gas laser, or an excimer laser of XeF, XeCl, XeBr, KrF, KrCl, ArF, ArCl, or the like may be used as the light source. The light sources having the output in the range not less than 10 W nor more than 5000 W are generally used, but the light sources having the output in the range not less than 100 W nor more than 1000 W are sufficient for the embodiment.

By means of the firing process as described above, the dispersion medium included in the liquid line 32$p$ is volatilized and therefore the electrical contacts between conductive fine particles are secured. The electrical wiring 32 is thereby formed.

A liquid post 34$p$, which will be a conducting post later, is written and formed at an end of the fired electrical wiring 32 (step 9). The writing is performed, as same as the writing of the liquid line 32$p$ in step 7, by the droplet discharge method using the droplet discharge device described later. What is discharged at this point is a droplet of the dispersion liquid having conductive fine particles, which is a material for forming the conducting post 34, dispersed in the dispersion medium (a second droplet). Specifically, it is the same as the liquid in use for writing the liquid line 32$p$. Namely, it is sufficient that the second droplet is discharged at the position where the conducting post 34 is to be formed by using the same droplet discharge head filled with the same liquid as in writing the liquid line 32$p$ after writing the liquid line 32$p$.

The volume of the second droplet discharged from the droplet discharge head for writing the liquid post 34$p$, however, should be greater than the volume of the first droplet discharged from the droplet discharge head for writing the liquid line 32$p$. As an example, it is assumed that the volume of the first droplet is around 3 pl and the volume of the second droplet is around 15 pl. Specifically, the volume of the second droplet is greater than the volume of the first droplet by making a first electrical signal input to the droplet discharge head for discharging the first droplet different from a second electrical signal input to the droplet discharge head for discharging the second droplet.

Figure 4:
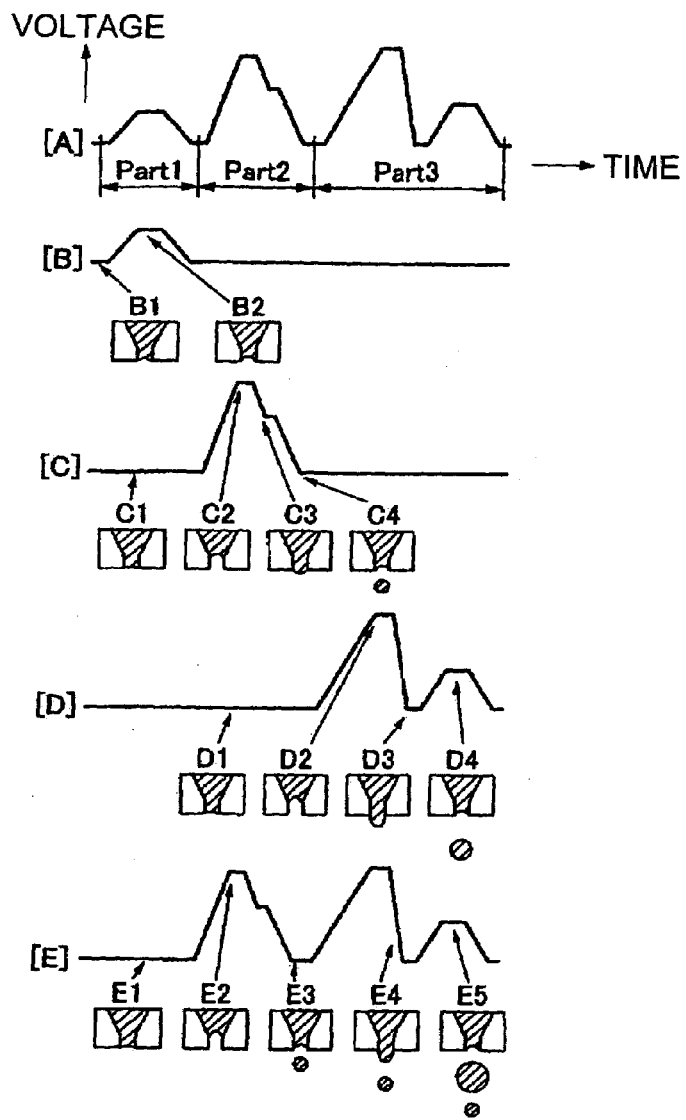
FIGS. 4A, 4B, 4C, 4D, and 4E are examples of electrical signals that are input to the piezoelectric element of the droplet discharge head.

FIG. 4 shows an example of the electrical signal input to a piezoelectric element of the droplet discharge head. The description will be given below with reference to FIG. 4 on the principle of discharging three types of droplets having different volumes, which produce a minute dot, a medium dot, and a large dot, respectively. In FIG. 4, the drive waveform [A] is a basic waveform generated by the drive signal generation circuit.

The waveform [B] is formed of Part 1 of the basic waveform, and is used for oscillating the meniscus (the surface of a liquid in the nozzle) and dispersing the thickened liquid in the vicinity of the nozzle orifice to prevent the defective discharge of a minute droplet. The item B1 indicates a state in which the meniscus is statically determinate. The item B2 shows a motion of expanding the volume of the liquid chamber (the ink chamber) and slightly drawing the meniscus into the nozzle by gradually charging the piezoelectric element.

The waveform [C] is formed of Part 2 of the basic waveform, and is the waveform for discharging the droplet that produces a minute dot. The piezoelectric element is rapidly charged from a state in which the meniscus is statically determinate (C1) and the meniscus is quickly drawn into the inside of the nozzle. Next, the liquid chamber is slightly contracted (C3) in accordance with the timing with which the meniscus once drawn starts its vibration again in the direction of filling the nozzle, thereby flying the droplet that produces a minute dot. The second electrical discharge (C4) after the electrical discharge is stopped on the way serves for damping the meniscus after discharge motion as well as the residual signal of the piezoelectric element and controlling the form in which the droplet flies.

The waveform [D] is formed of Part 3 of the basic waveform, and is the waveform for discharging a droplet that produces a medium dot. The meniscus is gently and largely drawn into the inside of the nozzle (D2) from the statically determinate state (D1). Next, the liquid chamber is rapidly contracted (D3) in accordance with the timing with which the meniscus is towards the direction of filling the nozzle again, thereby discharging a droplet that produces a medium dot. In the state shown in the item D4, the piezoelectric element is electrically charged/discharged, damping the meniscus and the residual vibration of the piezoelectric element.

The waveform [E] is formed of a combination of Part 2 and Part 3 of the basic waveform, and is the waveform for discharging the droplet that produces a large dot. In the processes shown by the items E1, E2, and E3, a droplet producing a small dot is discharged. Next, the vibration of the meniscus remaining as little as possible after the discharge of the droplet producing a small dot applies a waveform that discharges a droplet producing a medium dot to the piezoelectric element in accordance with the timing with which the inside of the nozzle is filled with a liquid. The droplet discharged in the processes shown by items E4 and E5 has a larger volume than the volume of the droplet producing a medium dot, and therefore combining the droplet with the foregoing droplet producing a small dot forms a droplet producing a further large dot.

In comparison between the waveform [C] and the waveform [D], when the droplet is discharged (when a piezoelectric element is electrically discharged), the larger the absolute value of the change ratio (the slope of a graph where a horizontal axis represents time and a vertical axis represents voltage) of an electrical signal input to the droplet discharge head is, the larger the volume of the discharged droplet is. The volume of the discharged droplet in the case without a change pause section in an electrical signal when the droplet is discharged as shown in the waveform [D] is greater than that in the case with a change pause section (C3) as shown in the waveform [C]. The larger the amount of change when the droplet is discharged (the height of the slope section in the electrical signal graph) is, the larger the volume of the discharged droplet is. On the other hand, as shown in the waveform [E], the volume of the discharged droplet increases by the discharge of the droplet in accordance with the vibration of the meniscus. Namely, a discharge (electrical discharge) signal is given to the droplet discharge head with the timing with which the meniscus vibrates in the direction of filling the nozzle and a suction (electrical charge) signal is given with the timing with which the meniscus is drawn into the inside of the nozzle, thereby increasing the volume of the discharged droplet.

It is sufficient to increase the absolute value of the change ratio of the second electrical signal, which is input to the droplet discharge head for discharging the second droplet for writing a liquid post, when the droplet is discharged, compared to the first electrical signal input to the droplet discharge head for discharging the first droplet for writing a liquid line. The amount of change of the electrical signal when the droplet is discharged may increase, and the change pause section of the electrical signal when the droplet is discharged may be eliminated. The droplet may be discharged in accordance with the vibration of the meniscus. Additionally, any one of these ways may be employed and several of them may be simultaneously employed. Thus, the volume of the second droplet for writing a liquid post is enabled to be greater than the volume of the first droplet for writing a liquid line.

As described above, the conducting post must be formed to have a significant height. For this purpose, a number of droplets must be discharged and deposited by the droplet discharge method to form a liquid post with a significant height. In the embodiment, because the volume of the second droplet discharged from the droplet discharge head for writing and forming a liquid post is greater than that of the first droplet for writing a liquid line, a liquid post with a significant height can be written and formed with a relatively small number of droplets for a short time.

Figure 5:
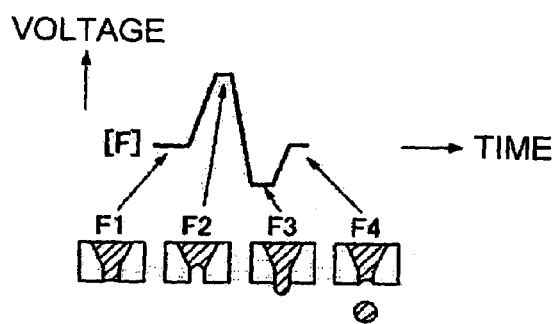
FIG. 5 is an example of electrical signals for discharging many droplets per unit time.

FIG. 5 shows an exemplary electrical signal for discharging many droplets per unit time. As for the waveform [F] of FIG. 5, the meniscus is statically determinate in a state in which a midpoint potential is applied to the piezoelectric element as shown by the item F1. The meniscus is rapidly drawn into the inside of the nozzle by charging the piezoelectric element (F2). In accordance with the timing with which the meniscus vibrates in the direction of filling the nozzle, the piezoelectric element is dynamically extended. Following the motions of the piezoelectric element, the liquid chamber contracts, and as a result, the meniscus protrudes (F3) and a droplet is discharged. Furthermore, the piezoelectric element is recharged up to the midpoint potential with the timing with which the residual vibration of the meniscus and the piezoelectric element is dampened (F4). Thus, droplets can be discharged in a short cycle by repeating the meniscus vibration and excitation.

For the second electrical signal for writing a liquid post and/or the first electrical signal for writing a liquid line, a suction signal and a discharge signal may be repeated from the state in which the midpoint potential is applied to the piezoelectric element in accordance with the vibration of the meniscus. Thus, droplets can be discharged in a short cycle, leading to the reduction of writing time.

In step 9 described above, a number of droplets are discharged and deposited by the droplet discharge method to form the liquid post 34$p$ with a significant height as shown in FIG. 2B. Discharging a number of droplets at one time, however, has difficulty securing the height of the liquid post 34$p$. On the contrary, this might increase the diameter of the liquid post 34$p$, leading to the short circuit of the liquid post to the adjacent electrical wiring and conducting post. Therefore, discharging a small number of droplets and tentative drying may be repeated by dividing the droplet discharge mentioned above into plural discharges. Thus, discharging a new droplet after tentatively drying the droplet discharged beforehand prevents the spread of the new droplet on the surface of the substrate dielectric film 51. The liquid post 34$p$ can thereby be formed to have a significant height (refer to the second embodiment).

The tentative drying described above is performed so that at least surfaces of the small number of discharged droplets are dried. Specifically, dry air such as low humidity air or an inactive gas is blown to the discharged droplet. The temperature of the dry air may be either normal (around 25 degree Celsius) or high. Instead of blowing the dry air, infrared rays may be radiated to the discharged droplet by using infrared lamp, etc. Thus, employment of the blow of dry air and infrared radiation enables tentative drying with the simple manufacturing facilities and manufacturing processes, making it possible to control the rise of facilities cost and manufacturing cost. The temperature can be immediately returned to the normal temperature even if the temperature rises temporarily due to tentative drying, enabling the reduction of manufacturing time.

Returning to FIG. 2B, the liquid post 34$p$ written and formed is fired (step 10). Specifically, the film substrate 31 on which the liquid line 32$p$ and liquid post 34$p$ are formed is heated on the hot plate at 150 degree Celsius for around 30 minutes. The dispersion medium included in the liquid post 34$p$ is thereby vaporized and the electrical contact between conductive fine particles is secured, forming the conducting post 34.

The liquid line 32$p$ written and formed in step 7 may be tentatively dried instead of firing in step 8, and the liquid post 34$p$ may be written and formed on an end of the liquid line in step 9. In this case, the liquid line 32$p$ and liquid post 34$p$ that are tentatively dried are collectively fired by firing in step 10. Thus, adhesion between the electrical wiring 32 and conducting post 34 can be improved. The whole is collectively fired in the final process, and therefore manufacturing processes can be simplified.

As a precondition to forming the intra-layer dielectric film 52 in the layer in which the electrical wiring 32 is formed, the contact angle of the surface of the substrate dielectric film 51 is controlled (step 11). The cured surface of the substrate dielectric film 51 exhibits lyophobicity. Therefore, an excimer UV laser beam at a wavelength of 172 nm is applied to the surface for around 60 seconds to provide the surface with lyophilicity.

The intra-layer dielectric film 52 is then written and formed around the electrical wiring 32 (step 12). This writing is performed by using a droplet discharge device as same as the writing of the substrate dielectric film 51. A clearance is made around the conducting post 34 and electrical wiring 32, and a resin material is discharged to the outside of the clearance. If the resin material that is a material for forming the intra-layer dielectric film 52 is discharged to contact the conducting post 34, the resin material in a wet state might be raised to the upper edge of the conducting post 34, making the conductive connection to the upper layer electrical wiring 36 impossible.

Subsequently, an excimer UV laser beam at a wavelength of 172 nm is applied to the clearance around the conducting post 34 and electrical wiring 32 for around 10 seconds to perform the lyophilic processing (step 13). Because the clearance around the conducting post 34 and electrical wiring 32 is provided with lyophilicity by this processing, the resin material flows into the clearance and contacts the conducting post 34 and electrical wiring 32. In this case, the resin material in a wet state is raised onto the surface of the electrical wiring 32, but is not raised to the upper edge of the conducting post 34. Consequently, the conductivity between the conducting post 34 and the upper layer electrical wiring 36 can be secured.

Then, the discharged resin material is cured (step 14). Specifically, the UV curable resin that is a material for forming the intra-layer dielectric film 52 is cured by applying a UV beam at a wavelength of 365 nm to it for around 4 seconds. The intra-layer dielectric film 52 is thus formed.

The interlayer dielectric film 54 is written and formed mainly on the surface of the electrical wiring 32 (step 15). This writing is also performed by using the droplet discharge device as same as the writing of the substrate dielectric film 51. In this case, it is also desirable that a clearance be created around the conducting post 34 and a resin material be discharged to the clearance.

Subsequently, the discharged resin material is cured (step 16). Specifically, the UV curable resin that is a material for forming the interlayer dielectric film 54 is cured by applying a UV beam at a wavelength of 365 nm to it for around 60 seconds. The interlayer dielectric film 54 is thus formed.

The upper electrical wiring 36 is formed on the surface of the interlayer dielectric film 54. The specific method is the same as the method for forming the lower layer electrical wiring 32 in steps 6 through 10.

Subsequently, the intra-layer dielectric film 56 is formed in the layer in which the electrical wiring 36 is formed. The specific method is the same as the method for forming the intra-layer dielectric film 52 in the layer in which the electrical wiring 32 is formed in steps 11 through 14. Furthermore, if the processes in steps 15 and 16 are performed, an interlayer dielectric film can be formed on the surface of the upper electrical wiring 36.

Electrical wirings can be deposited by repeating steps 6 through 16 in this manner. Additionally, on the surface of the electrical wiring as the uppermost layer, the protective film 58 only has to be formed by the same method as in steps 15 and 16.

By the processes as has been described, the wiring pattern of the embodiment shown in FIGS. 2A and 2B is formed.

The wiring pattern formation method of the embodiment, as described above, includes the processes of discharging the first droplet containing a material for forming an electrical wiring and forming the electrical wiring (steps 7 and 8), and discharging a second droplet containing a material for forming a conducting post and forming the conducting post (steps 9 and 10), and is structured so that the volume of the second droplet is larger than that of the first droplet. In this structure, the second droplet having a large volume is discharged, enabling the conducting post with a significant height to be formed for a short time. Accordingly, multilayered wiring patterns can be attained. On the other hand, the first droplet with a small volume is discharged, enabling the electrical wiring with a small width to be formed. Accordingly, miniaturization of wiring patterns can be attained. As an example, the conventional 50 μm line widths and 50 μm space widths of a plurality of electrical wirings can be miniaturized to around 30 μm line widths and around 30 μm space widths.

As the wiring pattern is miniaturized and multilayered, small-sized FPCs are enabled and small-sized electro-optic devices and electronic devices that employ the FPCs are also enabled.

Because the droplet discharge technique is employed for forming an electrical wiring, a conducting post, and various types of dielectric films in the wiring pattern formation method of the embodiment, increase of the efficiency in material use becomes possible. The manufacturing cost can thereby be reduced.

The description has been given taking the method of forming a wiring pattern of a FPC as an example in the embodiment, and an embodiment of the invention can be applied as the method of forming a wiring pattern in a hard board. The description in the embodiment has been given for the case in which a conducting post is formed in part of an electrical wiring, and the case in which a conducting post is formed on an electrode land of the electrical wiring is included in the technical scope of an embodiment of the invention.

Second Embodiment

Figure 7A:
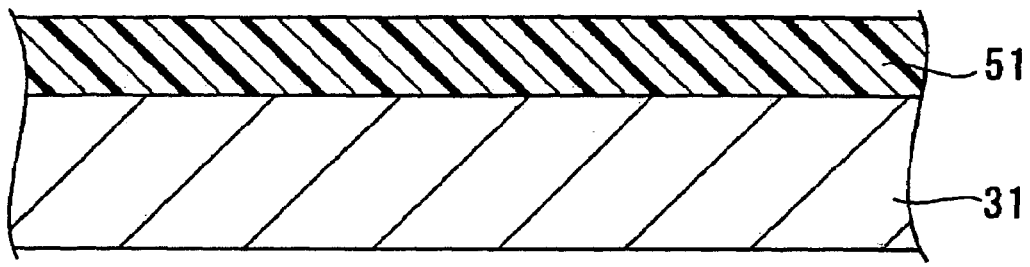
FIGS. 7A to 8B are explanatory views of the wiring pattern formation method according to the second embodiment.

FIG. 6 is a process table of a wiring pattern formation method according to the second embodiment. FIGS. 7A to 8B are explanatory views of the wiring pattern formation method according to the second embodiment. The processes will be described below in the order of step numbers in the leftmost column of FIG. 6. The processes in steps 1 to 6 and steps 11 to 16 are the same as in the first embodiment and the description thereof will be omitted. Initially, as shown in FIG. 7A, the substrate dielectric film 51 is formed on the surface of the substrate dielectric film 51.

Figure 7B:
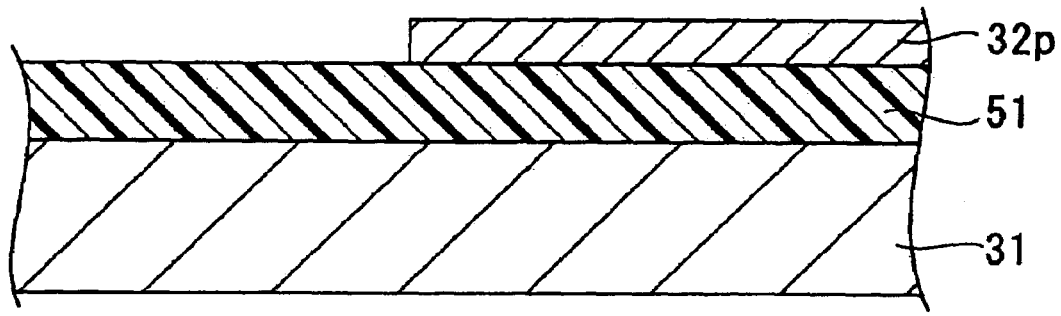

As shown in FIG. 7B, the liquid lien 32p that will later be an electrical wiring is written and formed on the surface of the substrate dielectric film 51 (step 7a). This writing is performed by the droplet discharge method using the droplet discharge device described later. What is discharged at this point is a dispersion liquid in which conductive fine particles, which is a material for forming the electrical wiring, are dispersed in the dispersion medium. Silver is preferably used as the conductive fine particles. Furthermore, metal fine particles containing any one of gold, copper, palladium, and nickel, and fine particles of conductive polymer and superconductor may be used.

The conductive fine particles having the surface coated with an organic matter may be used in order to improve its dispersibility. As coating materials used for coating the surface of conductive fine particles, polymers to induce steric hindrance or electrostatic repulsion are mentioned. It is preferable that the particle size of the conductive fine particles be not less than 5 nm nor greater than 0.1 μm. If the particle size is greater than 0.1 μm, the nozzle tends to be clogged, and thus the discharge with a droplet discharge head becomes difficult. If the particle size is less than 5 nm, the volume ratio of a coating agent to conductive fine particles increases, and therefore the ratio of the organic matter in the conductive material obtained becomes excessive.

The dispersion medium used must be one by which the above conductive fine particles can be dispersed and cohesion is not caused, and there is no other particular restriction on the dispersion medium used. Alcohol such as methanol, ethanol, propanol, and butanol; hydrocarbon compounds such as n-heptane, n-octane, decane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis(2-methoxyethyl)ether, and p-dioxane; and polar compounds such as propylene carbonate, γ-butyrolactone, N-methyl-2-pyrrolidone, dimethylformamide, dimethylsulfoxide, and cyclohexanone; other than water, may be mentioned as the dispersion medium used. Among them, water, alcohol, hydrocarbon compounds, and ether compounds are preferable in regard to the dispersibility of fine particles and the stability of the dispersion liquid, as well as the ease of their application to the droplet discharge method; water and hydrocarbon compounds may be mentioned as the particularly preferable dispersion media. These dispersion media may be used independently or as a mixture of two or more types.

It is preferable that the dispersion medium of the liquid containing conductive fine particles have a vapor pressure not less than 0.001 mmHg nor more than 200 mmHg (approximately not less than 0.133 Pa nor more than 26600 Pa) at room temperature. If the vapor pressure exceeds 200 mmHg, the dispersion medium evaporates rapidly after discharge, making it difficult to form a good conductive material.

It is further preferable that the dispersion medium have a vapor pressure not less than 0.001 mmHg nor more than 50 mmHg (approximately not less than 0.133 Pa nor more than 6650 Pa). If the vapor pressure exceeds 50 mmHg, nozzle clogging due to drying is easy to occur when a droplet is discharged by the droplet discharge method, making the stable discharge difficult. On the other hand, if the dispersion medium has a vapor pressure less than 0.001 mmHg at room temperature, drying is delayed and the dispersion medium is likely to remain in the conductive material, making it difficult to obtain a high-quality conductive material after heat and/or optical processing in the later process.

The dispersoid density in which the above conductive fine particles disperse in the dispersion medium is not less than 1 mass % nor more than 80 mass %, which can be adjusted depending on a desired thickness of the conductive material. If the dispersoid density exceeds 80 mass %, cohesion is likely to occur, making it difficult to obtain a uniform conductive material.

It is preferable that the surface tension of the dispersion liquid containing the above conductive fine particles is in the range not less than 0.02 N/m nor more than 0.07 N/m. If the surface tension is under 0.02 N/m when a liquid is discharged by the droplet discharge method, the wettability of an ink composition to the nozzle surface increases and therefore the deflection is likely to occur, while if the wettability exceeds 0.07 N/m, the shape of meniscus at the tip of the nozzle is not stable and therefore it is difficult to control the discharge amount and discharge timing.

A minute amount of fluorine-based, silicon-based, or non-ion-based surface tension adjusting agent can be added to the dispersion liquid mentioned above in order to adjust its surface tension unless the contact angle to the substrate dielectric film 51 is unduly reduced. The nonion-based surface tension adjusting agent makes the wettability to the substrate dielectric film 51 good, improves the leveling of the film, and helps prevent the roughness and orange peel of a coating film. It is safe that the dispersion liquid mentioned above includes alcohol, ether, ester, ketone, and other organic compounds when necessary.

It is preferable that the dispersion liquid mentioned above have the viscosity not less than 1 mPa·s nor more than 50 mPa·s. If the viscosity is less than 1 mPa·s when the liquid is discharged by the droplet discharge method, the periphery of the nozzle is likely to be contaminated due to the outflow of ink, while if the viscosity is more than 50 mPa·s, the frequency of clogging in a nozzle hole increases, making it difficult to smoothly discharge a droplet.

In the embodiment, the droplet of the dispersion liquid mentioned above (the first droplet) is discharged from a droplet discharge head and dropped to a location where an electrical wiring is to be formed. At this point, adjusting the overlap of droplets discharged subsequently is desirable to prevent the creation of a bulge. In particular, the discharge method in which a plurality of droplets are discharged separately so as to be not in contact with one another at a first discharge and the spaces are filled up at the subsequent discharges is desirable.

Thus, the liquid line 32p is formed on the surface of the substrate dielectric film 51.

The liquid line 32p is then tentatively dried (step 7b). The tentative drying is performed so that at least the surface of the liquid line 32p is dried. Specifically, dry air such as low humidity air or an inactive gas is blown to the liquid line 32p. The temperature of the dry air may be either normal (around 25 degree Celsius) or high. Instead of blowing the dry air, infrared rays may be radiated to the liquid line 32p by using infrared lamp, etc. Thus, employment of the blow of dry air or infrared radiation as the specific method of tentative drying enables tentative drying with the simple manufacturing facilities and manufacturing processes, making it possible to control the rise of facilities cost and manufacturing cost. The temperature can be immediately returned to the normal temperature even if the temperature rises temporarily due to tentative drying, enabling the reduction of manufacturing time.

Figure 7C:
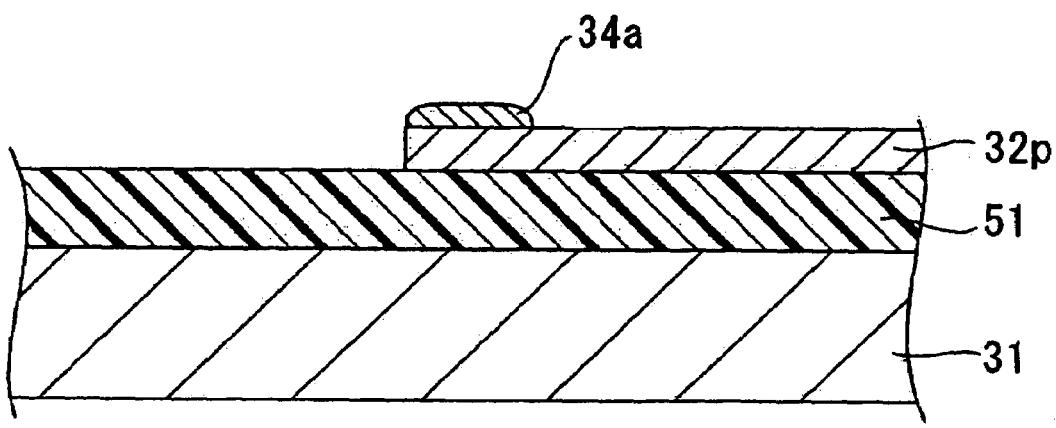

As shown in FIG. 7C, a liquid subpost 34a, which will be a conducting post later, is written and formed at part of the liquid line 32p tentatively dried (step 8a). The writing is performed, as same as the writing of the liquid line 32p in step 7a, by the droplet discharge method using the droplet discharge device described later. What is discharged at this point is a droplet of the dispersion liquid having conductive fine particles, which is a material for forming the conducting post, dispersed in the dispersion medium (a second droplet). Specifically, it is the same as the liquid droplet (a first droplet) in use for writing the liquid line 32p. Namely, it is sufficient that the liquid is discharged at the position where the conducting post 34 is to be formed by using the same droplet discharge head as in writing the liquid line 32p after writing the liquid line 32p.

As described above, the conducting post must be formed with a substantial height. For this purpose, it is necessary that a number of droplets be discharged and deposited by the droplet discharge method to form the liquid post with a significant height. Discharging a number of droplets at one time, however, has difficulty securing the height of the liquid post. On the contrary, this might increase the diameter of the liquid post, leading to the short circuit of the liquid post to the adjacent electrical wiring and conducting post. Therefore, the droplet discharge is divided and performed plural times. A liquid subpost lower than the required liquid post is formed by one liquid discharge. For example, about 10 droplets are discharged by one discharge to write and form a first layer liquid subpost 34a.

The liquid subpost 34a is then tentatively dried (step 8b). The tentative drying is performed so that at least the surface of the liquid subpost 34a is dried. Specifically, employment of the blow of dry air or infrared radiation is desirable as same as in the method of tentative drying in step 7b.

Figure 8A:
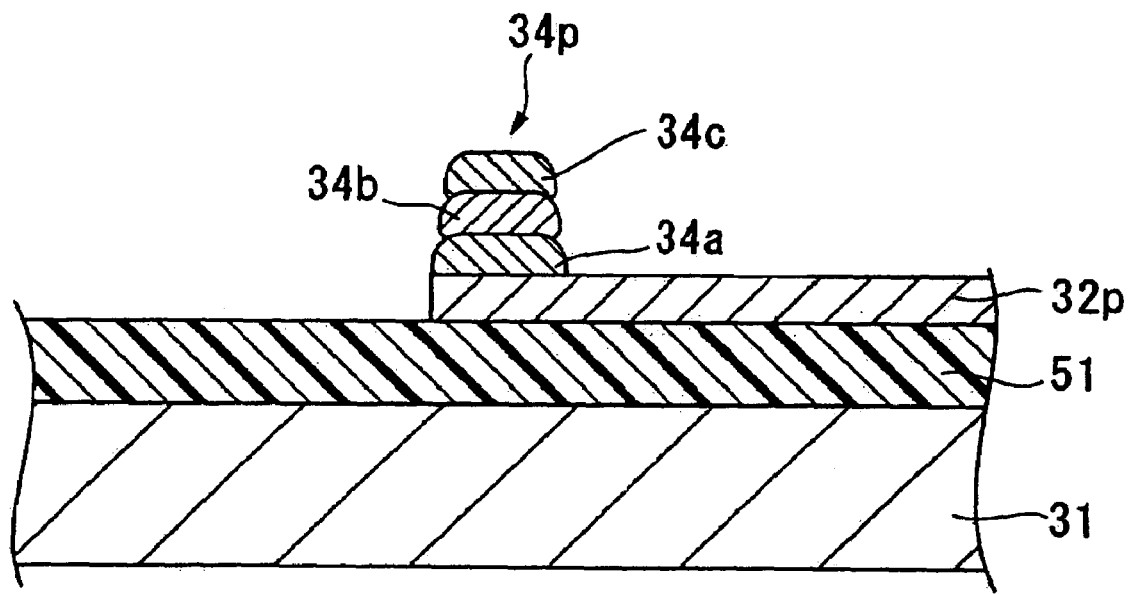

Then, steps 8a and 8b are repeated (step 9). Because the liquid subpost 34a as the first layer is tentatively dried as described above, a new droplet never spreads on the surface of the substrate dielectric film 51 even if the new droplet is discharged on the surface. If about 10 new droplets are discharged, a liquid subpost 34b as a second layer can be deposited on the liquid subpost 34a as the first layer as shown in FIG. 8A. Thus, by repetition of steps 8a and 8b, the plurality of liquid subposts 34a, 34b, and 34c are deposited to form the liquid post 34p with a significant height.

The liquid line 32p and liquid post 34p are then regularly fired (step 10). As described above, either the liquid line 32p or the liquid subpost 34a, 34b, and 34c are formed in the state of being tentatively dried, and therefore the whole of them are regularly fired at a time. Specifically, the film substrate 31 on which the liquid line 32p and liquid post 34p are formed is heated on a hot plate at 150 degree Celsius for around 30 minutes.

The regular firing process is normally performed in the atmosphere, and may be performed in an inert gas atmosphere such as nitrogen, argon, and helium if necessary. The processing temperature of the regular firing was set to be 150 degree Celsius in this case, but it is desirable to suitably set the temperature in consideration of the boiling point (vapor pressure) of the dispersion medium included in the liquid line 32p and liquid post 34p, the type and pressure of an atmosphere gas, thermal behaviors such as dispersibility and oxidation of fine particles, the presence or absence and the quantity of a coating material, the upper temperature limit of a base material, etc.

The firing process in this manner may be performed by lamp annealing other than the typical processing by use of a hot plate, an electric furnace, etc. There is no particular restriction on the light source used for lamp annealing; an infrared lamp, a xenon lamp, a YAG laser, an argon laser, a carbon dioxide gas laser, or an excimer laser of XeF, XeCl, XeBr, KrF, KrCl, ArF, ArCl, or the like may be used as the light source. The light sources having the output in the range not less than 10 W nor more than 5000 W are generally used, but the light sources having the output in the range not less than 100 W nor more than 1000 W are sufficient for the embodiment.

Figure 8B:
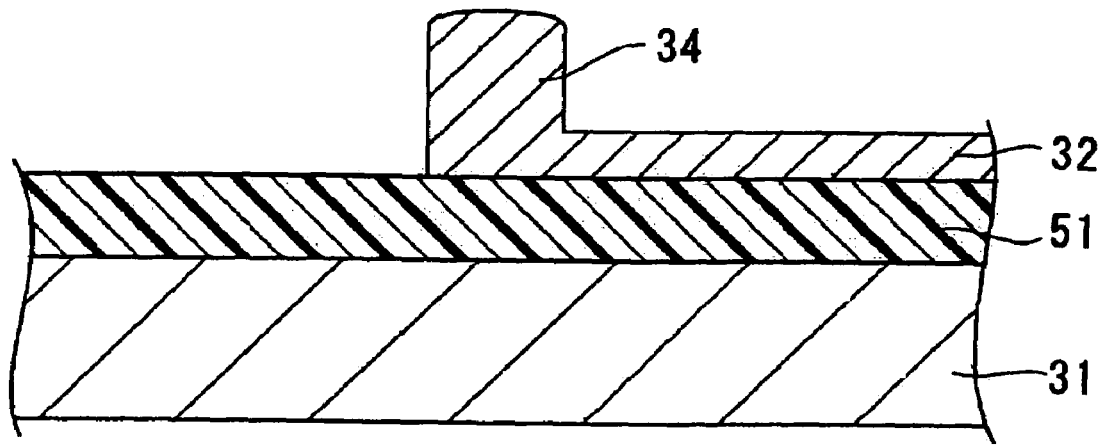

By means of the regular firing process as described above, the dispersion medium included in the liquid line 32$p$ and liquid post 34$p$ is volatilized and therefore the electrical contacts between conductive fine particles are secured. The electrical wiring 32 and conducting post 34 are thereby formed as shown in FIG. 8B.

As described above, the wiring pattern formation method in the embodiment is structured to include the process of writing and forming a liquid line by the droplet discharge method (step 7$a$), the process of tentatively drying the surface of the liquid line (step 7$b$), the process of writing and forming a liquid post on part of the liquid line by the droplet discharge method (step 8$a$), and the process of regularly firing the liquid line and the liquid post (step 10). According to this structure, because the liquid post is written and formed on the surface of the liquid line in the state of being tentatively dried, the liquid post and liquid line can be fused together at their interface. The electrical wiring and conducting post can be integrally formed by regularly firing the whole of the liquid line and liquid post. Thus, occurrence of a crack at the interface between the electrical wiring and conducting post can be prevented, and as a result, the wiring pattern excellent in reliability of conductive connection can be formed.

The wiring pattern formation method in the embodiment is also structured to include the process of writing and forming a liquid subpost by the droplet discharge method (step 8$a$), the process of tentatively drying the liquid subpost (step 8$b$), the process of repeating steps 8$a$ and 8$b$ (step 9), and the process of regularly firing the liquid subposts deposited to be multilayered (step 10). According to this structure, because the formation of the liquid subpost by droplet discharge and the tentative drying of the liquid subpost are repeated, the liquid subposts can be deposited to be multilayered without the spread of the discharged droplet in a wet state on a plane surface. A conducting post with a substantial height can be formed by regularly firing the whole of the liquid subposts deposited to be multilayered in the tentatively dried state.

Because the droplet discharge method is employed for forming an electrical wiring, a conducting post, and various types of dielectric films in the wiring pattern formation method of the embodiment, increase of the efficiency in material use becomes possible. The manufacturing cost can thereby be reduced. Additionally, wiring patterns can be multilayered and miniaturized. As an example, the conventional 50 μm line widths and 50 μm space widths of a plurality of electrical wirings can be miniaturized to around 30 μm line widths and around 30 μm space widths. Thus, small-sized FPCs are enabled and small-sized electro-optic devices and electronic devices that employ the FPCs are also enabled.

The description has been given taking the method of forming a wiring pattern of a FPC as an example in the embodiment, and an embodiment of the invention can be applied as the method of forming a wiring pattern in a hard board. The description in the embodiment has been given for the case in which a conducting post is formed on the electrical wiring, and the case in which a conducting post is formed on an electrode land of the electrical wiring is included in the technical scope of an embodiment of the invention.

[Droplet Discharge Device]

A droplet discharge device used in the droplet discharge method will next be described with reference to FIGS. 9 and 10.

Figure 9:
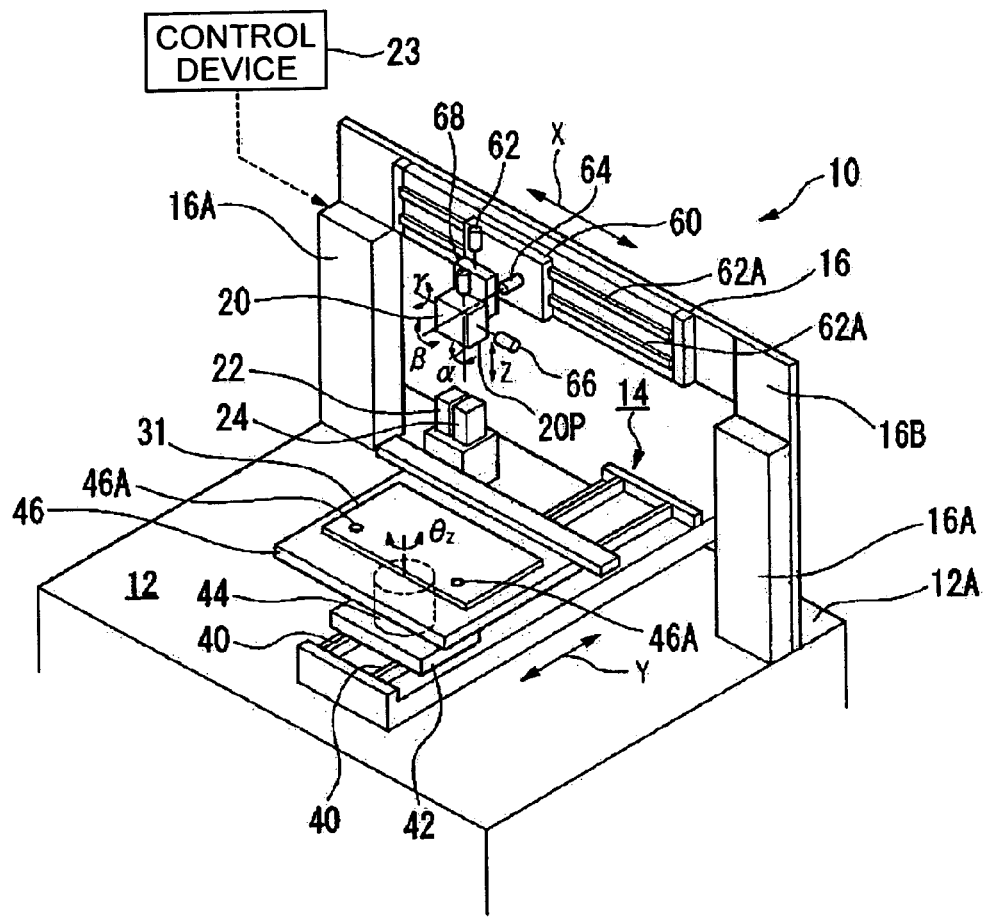
FIG. 9 is a perspective view of a droplet discharge device.
Figure 10:
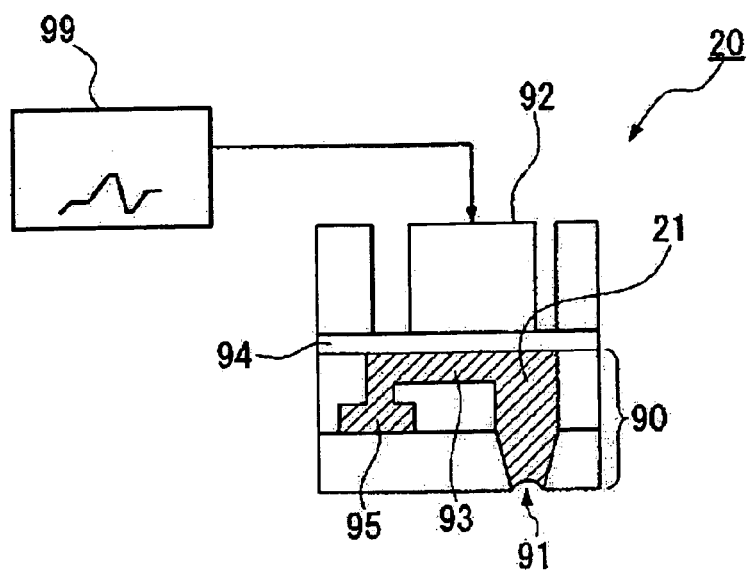
FIG. 10 is a sectional side view of a droplet discharge head.

FIG. 9 is a perspective view of the droplet discharge device. In FIG. 9, the X direction indicates the horizontal direction of a base 12; the Y direction, its cross direction; and the Z direction, its vertical direction. A droplet discharge device 10 mainly includes a droplet discharge head (hereinafter, refer to as just a head) 20 and a table 46 on which the substrate 31 is placed. The motion of the droplet discharge device 10 is controlled by a control device 23.

The table 46 on which the substrate 31 is placed can be moved and positioned in the Y direction by a first moving means 14, and can be oscillated and positioned in the θz direction by a motor 44. The head 20 can be moved and positioned in the X direction by a second moving means, and can be oscillated and positioned in the Z direction by a linear motor 62. The head 20 can also be oscillated and positioned in the directions of α, β, and γ by motors 64, 66, and 68, respectively. Thus, the relative location and position of the droplet discharge device 10 to an ink discharge surface 20P of the head 20 and the substrate 31 on the table 46 can be accurately controlled.

At this point, a structure example of the head 20 will be described with reference to FIG. 10. FIG. 10 is a sectional side view of a droplet discharge head. The head 20 discharges ink 21 from a nozzle 91 by the droplet discharge method. The various known techniques such as a piezoelectric method of discharging ink by the use of a piezoelectric element as a piezoelectric material element and a method of discharging ink with bubbles generated by heating ink may be applied as the droplet discharge method. Among them, the piezoelectric method has an advantage that it does not detrimentally affect the composition of materials because ink is not heated. Therefore, the piezoelectric method mentioned is adopted for the head 20 in FIG. 10.

A reservoir 95 and a plurality of ink chambers 93 divided from the reservoir 95 are formed in a head main body 90 of the head 20. The reservoir 95 is a channel for supplying ink into each ink chamber 93. A nozzle plate constituting an ink discharge surface is also mounted onto the lower end surface of the head main body 90. A plurality of nozzles 91 that discharge ink are opened in the nozzle plate, each nozzle corresponding to each ink chambers 93. An ink channel is formed from each ink chamber 93 towards the corresponding nozzle 91. On the other hand, a vibration plate 94 is mounted on the upper edge surface of the head main body 90. The vibration plate 94 constitutes a wall surface of each ink chamber 93. A piezoelectric element 92 is disposed outside the vibration plate 94, corresponding to each ink chamber 93. The piezoelectric element 92 has a piezoelectric material of crystal, etc., sandwiched by a pair of electrodes (not shown). The pair of electrodes are connected to a drive circuit 99.

When an electrical signal is input from the drive circuit 99 to the piezoelectric element 92, the piezoelectric element 92 becomes deformed due to expansion or deformed due to contraction. If the piezoelectric element 92 is deformed due to contraction, the pressure of the ink chamber 93 is reduced, and therefore the ink 21 flows from the reservoir 95 into the ink chamber 93. If the piezoelectric element 92 is deformed due to expansion, the pressure of the ink chamber 93 increases, and therefore the ink 21 is discharged from the nozzle 91. Additionally, the deformation amount of the piezoelectric element 92 can be controlled by changing the applied voltage. The deformation speed of the piezoelectric element 92 can also be controlled by changing the frequency of the applied voltage. Namely, the discharge conditions of the ink 21 can be controlled by controlling the applied voltage to the piezoelectric element 92.

A capping unit 22 shown in FIG. 9 caps the ink discharge surface 20P during waiting of the droplet discharge device 10 so as to prevent the ink discharge surface 20P in the head 20 from being dried. A cleaning unit 24 applies suction to the inside of the nozzle so as to remove clogging of the nozzle in the head 20. Additionally, the cleaning unit 24 can wipe the ink discharge surface 20P to remove contamination of the ink discharge surface 20P in the head 20.

[Electro-Optic Device]

The description has been given in the embodiment taking the wiring pattern formed on the FPC as an example. Returning to FIG. 1, a liquid crystal module, which is an example of the electro-optic device for which the FPC is employed.

FIG. 1 is an exploded perspective view of a liquid crystal module with the structure of COF A liquid crystal module 1 roughly includes the liquid crystal panel 2 for color display, the FPC 30 connected to the liquid crystal panel 2, and the liquid crystal drive IC 100 mounted on the FPC 30. A lighting system such as a backlight and other auxiliary equipment are additionally attached to the liquid crystal panel 2 if necessary.

The liquid crystal panel 2 has a pair of substrates 5a and 5b that are adhered with a seal material 4, and a liquid crystal is sealed in a gap, so-called a cell gap, between these substrates 5a and 5b. In other words, the liquid crystal is sandwiched by the substrates 5a and 5b. These substrates 5a and 5b are generally formed of a translucent material, for example, such as glass or synthetic resin. A polarization plate 6a is attached onto the outside surfaces of the substrates 5a and 5b.

Electrodes 7a are also formed on the inside surface of the substrate 5a, and electrodes 7b are formed on the inside surface of the substrate 5b. These electrodes 7a and 7b are formed of a translucent material, for example, such as indium tin oxide (ITO). The substrate 5a has an extending portion that extends over the substrate 5b, and a plurality of terminals 8 are formed on the extending portion. These terminals 8 are formed simultaneously with the electrodes 7a when the electrodes 7a are formed on the substrate 5a. Accordingly, these terminals 8 are formed of, for example, ITO. A terminal extending integrally from the electrode 7a and a terminal connected to the electrode 7b with a conductive material (not shown) therebetween are included in these terminals 8.

On the other side, the wiring patterns 39a and 39b are formed on the surface of the FPC 30 by the wiring pattern formation method according to the embodiment. Namely, the input wiring pattern 39a extending from one short side towards the center of the FPC 30 is formed, and the output wiring pattern 39b extending from the other short side towards the center is formed. Electrode pads (not shown) are formed on the ends of the center sides of these input wiring pattern 39a and output wiring pattern 39b.

The liquid crystal drive IC 100 is mounted on the surface of the FPC 30. Specifically, a plurality of bump electrodes formed on the active surface of the liquid crystal drive IC 100 are connected to a plurality of electrode pads formed on the surface of the FPC 30 with an amisotropic conductive film (ACF) 160 therebetween. The ACF 160 is formed with a number of conductive particles dispersed in the thermal plastic or thermosetting adhesive resin. Thus, so-called structure of COF is implemented by mounting the liquid crystal drive IC 100 on the surface of the FPC 30.

The FPC 30 with the liquid crystal drive IC 100 is connected to the substrate 5a of the liquid crystal panel 2. Specifically, the output wiring pattern 39b of the FPC 30 is electrically connected to the terminals 8 of the substrate 5a through the ACF 140. Additionally, the FPC 30 has flexibility, and can be adjustably folded. The FPC 30 can thereby require less space.

In the liquid crystal module 1 structured as described above, a signal is input to the liquid crystal drive IC 100 through the input wiring pattern 39a of the FPC 30. Then, a drive signal is output from the liquid crystal drive IC 100 through the output wiring pattern 39b of the FPC 30 to the liquid crystal panel 2. Thus, an image is displayed on the liquid crystal panel 2.

A device that converts electrical energy to optical energy and the like other than a device that has the electro-optic effect that the refractive index of a substance alters by the electric field to change the transmittance of light are included in the electro-optic devices of an embodiment of the invention. Namely, an embodiment of the invention can be widely applied not only to a liquid crystal display device but also to a light emitting device such as an electro-luminescent (EL) device, an inorganic EL device, a plasma display device, an electrophoretic display device, a display device using an electron emission element (a field emission display and a surface-conduction electron-emitter display, etc.,). For example, connecting a FPC with a wiring pattern of an embodiment of the invention to an organic EL panel to constitute an organic EL module is also possible.

[Electronic Device]

Figure 11:
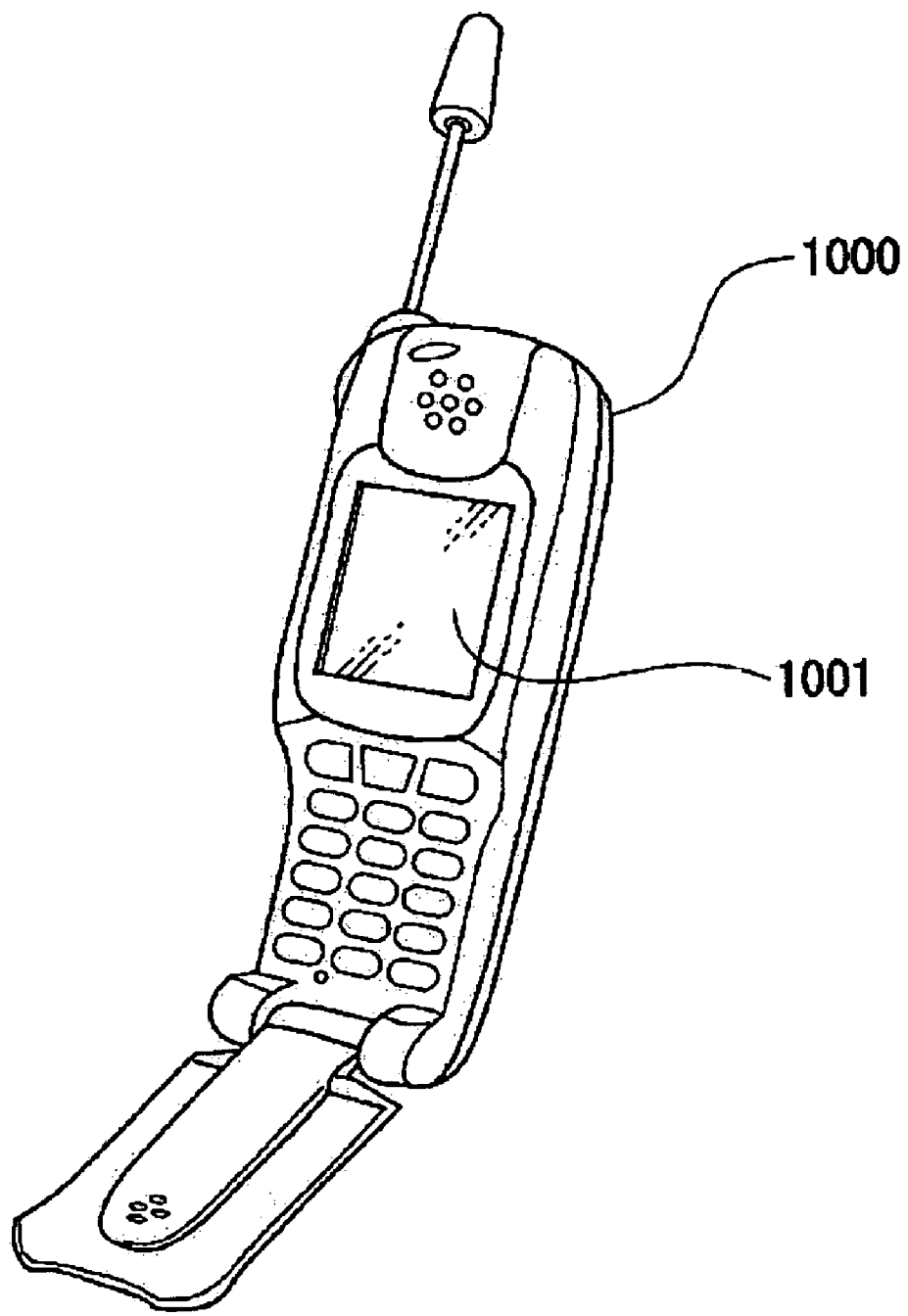
FIG. 11 is a perspective view of a cellular phone.

An electronic device manufactured by the use of the film formation method of the embodiment will be described with reference to FIG. 11. FIG. 11 is a perspective view of a cellular phone. In FIG. 11, a numeral 1000 denotes a cellular phone, and a numeral 1001 denotes a display. An electro-optic device with a wiring pattern of the embodiment is employed for the display 1001 of the cellular phone 1000. Accordingly, the small-sized cellular phone 1000 excellent in reliability of electrical connection can be provided.

An embodiment of the invention is not limited to the cellular phone mentioned above, and can be preferably used as an image display means of an electronic device such as an electronic book, a personal computer, a digital still camera, a liquid crystal television set, a view-finder type or monitor direct vision type video tape recorder, a car navigation system, a pager, a personal digital assistance, an electronic calculator, a word processor, a workstation, a TV telephone, a POS terminal, a touch panel, etc. In any case, a small-sized electronic device excellent in reliability of electrical connection can be provided.

Examples of an embodiment of the invention applied to multilayer wiring boards will be described below.

Figure 12:
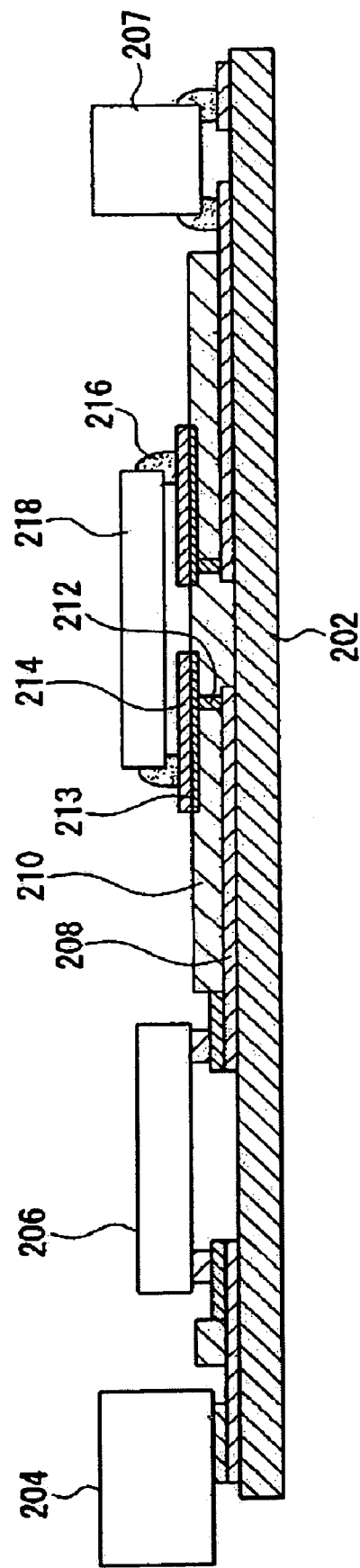
FIG. 12 is a sectional side view of a two-layer interconnection FPC.

FIG. 12 is a sectional side view of a two-layer interconnection FPC. A Cu wiring pattern 208 is formed on the surface of a polyimide substrate 202 in this FPC by using photolithography or the like. A liquid crystal panel 204 is ACF connected to one end of the Cu wiring pattern 208, and a connector 207, etc., is mounted on the other end by solder reflow. A driver IC 206 is also COF mounted onto the surface of the Cu wiring pattern 208 with an Au plate therebetween by thermocompression bonding. Furthermore, a conducting post 212 made of Al, etc., is formed on an end of the Cu wiring pattern 208 in the center part of the polyimide substrate 202 by the droplet discharge method. A dielectric film 210 made of a resin material or the like is formed to cover the Cu wiring pattern 208, while exposing the upper end of the conducting post 212 by the droplet discharge method. A mount land 213 made of Al, etc., is formed on the surface of the dielectric film 210 by the droplet discharge method, and an Au plate 214 is applied onto the surface of the mound land. Solder 216 is applied onto the surface of the Au plate 214, and chip parts 218 are mounted on the solder by reflow. Thus, the multilayer wiring is formed by the droplet discharge method, and the mount land 213 and COF mount unit are simultaneously plated. The two-layer interconnection FPC can thereby be manufactured effectively.

Figure 13:
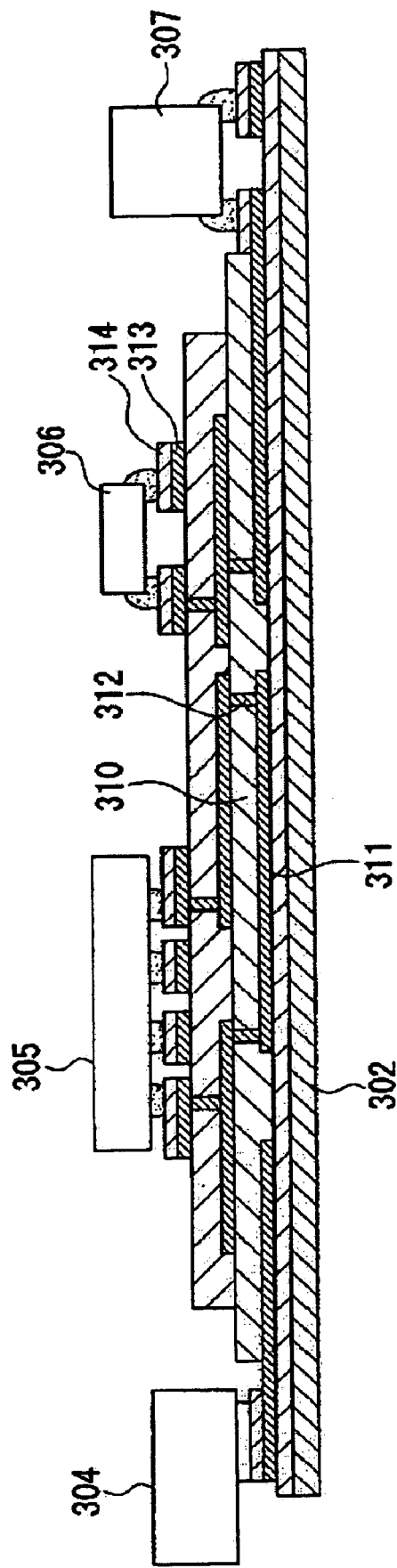
FIG. 13 is a sectional side view of a multilayer interconnection FPC.

FIG. 13 is a sectional side view of a multilayer interconnection FPC. Dielectric films 310 and electrical wirings 311 are alternately deposited to be multilayered on the surface of a polyimide substrate 302 in this FPC. The electrical wirings 311 of upper and lower layers are connected through a conducting post 312 penetrating the dielectric film 310. Amount land 313 is then formed on the surface of the dielectric film, an Au plate 314 is applied onto the surface of the mount land, and a connection terminal 304, a BGA/CSP 305, chip parts 306, a connector 307, etc., are mounted on the Au plate by solder reflow, etc. Either the dielectric film 310, electrical wiring 314, or conducting post 312 mentioned above is formed by the droplet discharge method, and therefore the multilayer interconnection FPC on which electronic parts can be mounted with 50 to 100 µm pitch can be achieved.

FIGS. 14A and 14B are sectional side views of a very high density module; FIG. 14A shows the minimum module and FIG. 14B shows the thinnest module.

An electrical wiring 502 and a dielectric film 504 are deposited to be multilayered as same as described above in the module of FIG. 14B. In this module, an LSI 518, a condenser dielectric 520, a resistor 524, and other passive parts 522 are mounted on the electrical wiring 502, which is an intermediate layer. The dielectric film 504 is formed by the droplet discharge method, and therefore these passive parts 522 are buried in the inside of the module. Thus, the thinnest module can be formed.

In the module of FIG. 14A, in addition to the parts described above, a mount land is formed on the top surface of the module, and W-CSO 412 and SiP 414 are mounted on the top surface. This W-CSP 412 includes electrodes of the chip surface rearranged in a high dense state. The SiP includes a chip implemented in three dimensions and packaged. Thus, the minimum module can be formed. It is also possible to form condenser dielectrics 420 and 520, and resistors 424 and 524 by the droplet discharge method.

Figure 15:
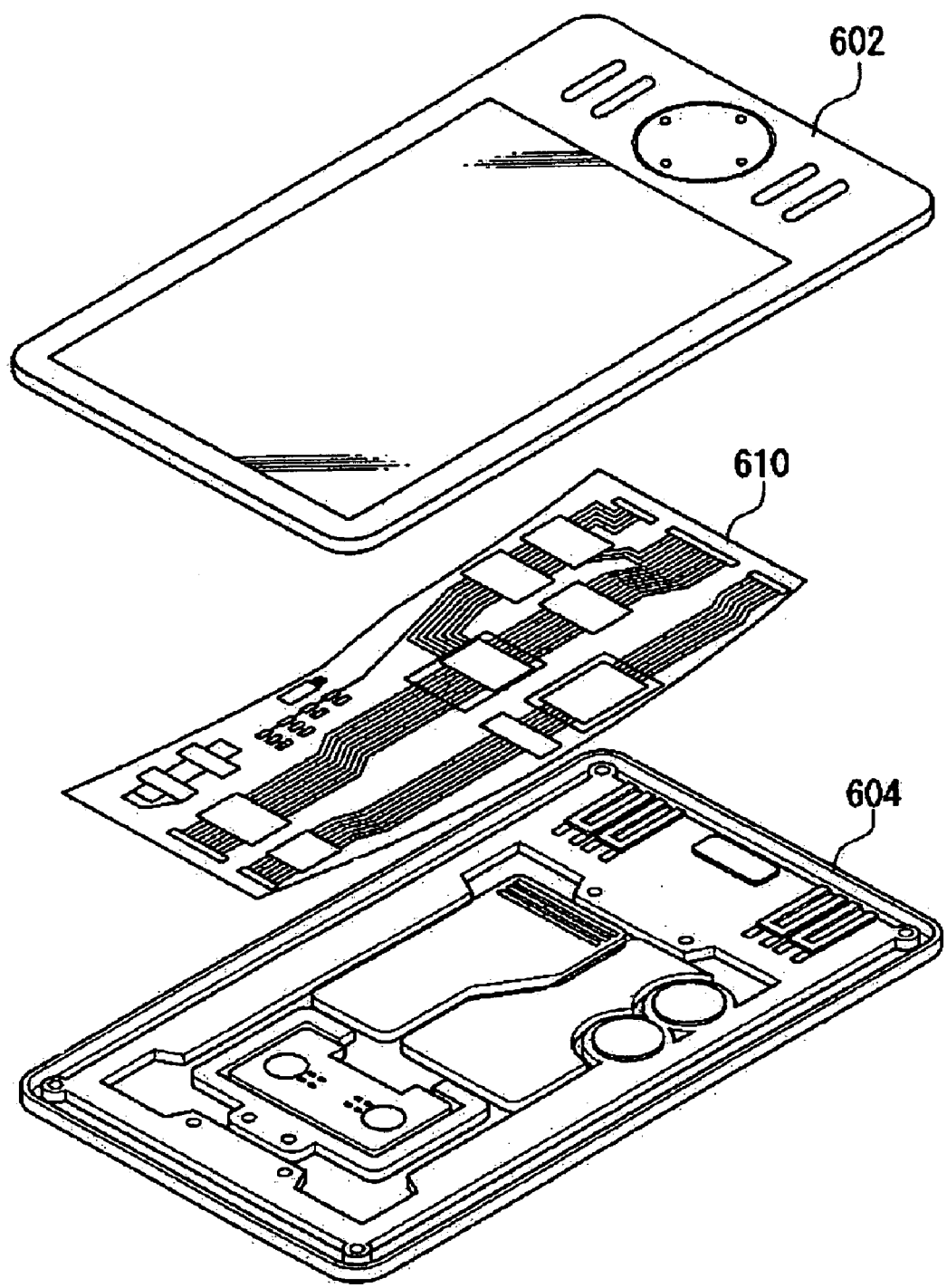
FIG. 15 is an exploded perspective view of an image display device.

FIG. 15 shows an exemplary structure in which the multilayer wiring board is placed in an electronic device, and is an exploded perspective view of an image display device. A multilayer wiring board 610, which is described above, is located in the inside between an upper frame 602 and a lower frame 604, and constitutes an image display device.

Figure 16:
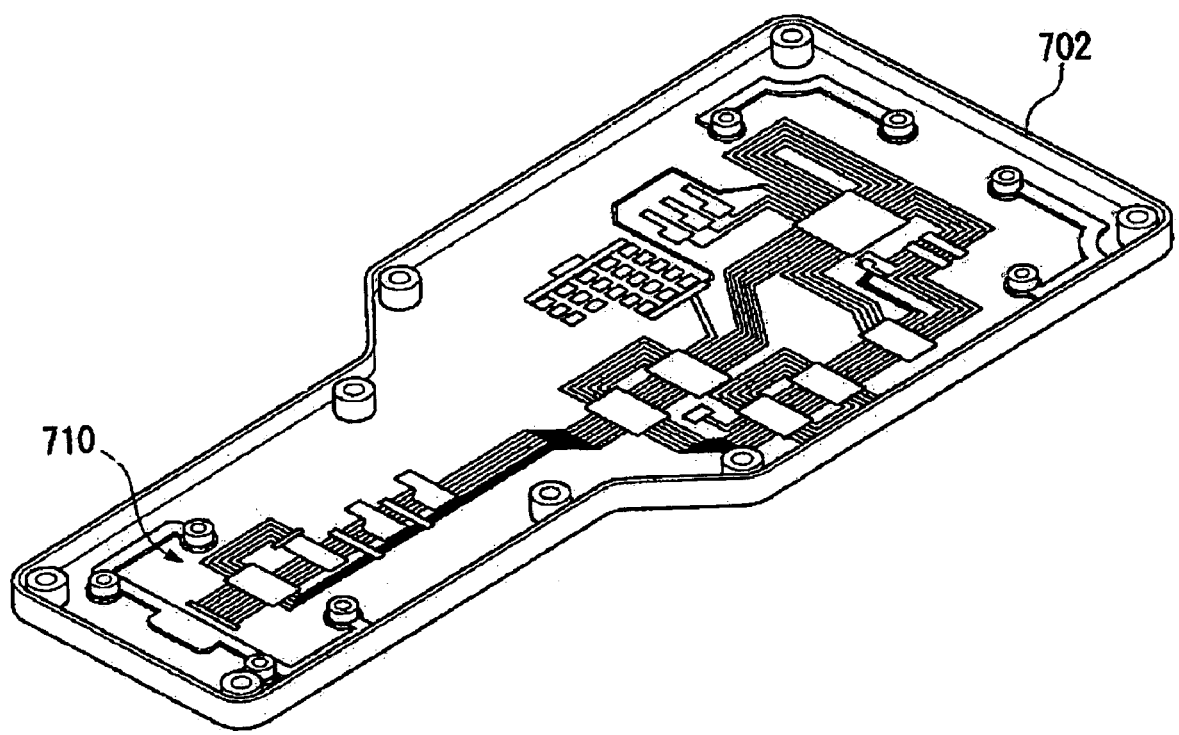
FIG. 16 is a perspective view of a frame on which wiring patterns are directly written.

FIG. 16 is a perspective view of a frame on which wiring patterns are directly written. It is also possible to write wiring patterns 710 directly on the inside surface of a frame 702 by using the wiring pattern formation method of an embodiment of the invention. Namely, a metal material is discharged by the droplet discharge method to form an electrical wiring, and a conducting post and a dielectric film is written (applied) and formed by the droplet discharge method, and as a result, the multilayer wiring patterns 710 can be formed directly on the inside surface of the frame 702. Thus, the number of parts and manufacturing cost of the electronic device can be reduced.

The technical scope of an embodiment of the invention is not limited to the embodiments described above, and includes what is made by adding various modifications to the embodiments described above within the scope that does not depart from the spirit of the invention. Namely, specific materials and structures mentioned in the embodiments are only illustrative, and may be changed suitably.

What is claimed is:

1. A method of forming a wiring pattern in which a plurality of electrical wirings deposited to be multilayered are conductively connected to one another through a conducting post, the method comprising:
   forming the electrical wiring by discharging a first droplet including a material for forming the electrical wiring; and
   forming the conducting post by discharging a second droplet including a material for forming the conducting post;
   wherein a volume of the second droplet is greater than a volume of the first droplet.

2. The method of forming a wiring pattern according to claim 1, wherein a second electrical signal voltage that is input to a voltage dependent droplet discharge device so as to discharge the second droplet has a large amount of change, when compared to a first electrical signal that is input to the droplet discharge device to discharge the first droplet.

3. The method of forming a wiring pattern according to claim 1, wherein the ratio of a second electrical signal that is input to a droplet discharge device so as to discharge the second droplet, compared to a first electrical signal that is input to the droplet discharge device to discharge the first droplet, has a large absolute value of change ratio.

4. The method of forming a wiring pattern according to claim 1, wherein a second electrical signal that is input to a droplet discharge device so as to discharge the second droplet has a change in voltage pause section of an electrical signal.

5. A method of forming a wiring pattern in which a plurality of electrical wirings multilayered are conductively connected to one another through a conducting post, the method comprising:
   writing and forming a liquid line by discharging a first droplet including a material for constituting the electrical wiring;
   tentatively drying a surface of the liquid line;
   writing and forming a liquid post on the liquid line by discharging a second droplet including a material for constituting the conducting post; and
   forming the electrical wirings and the conducting post by heating the liquid line and the liquid post;
   wherein in forming the liquid post, discharging the second droplet and tentative drying are repeated so that a plurality of liquid subposts are formed to be multilayered; and
   in heating the liquid post, the plurality of liquid subposts formed to be multilayered are heated so that the conducting post is formed.

6. The method of forming a wiring pattern according to claim 5, wherein the tentative drying is performed by blowing a gas.

7. The method of forming a wiring pattern according to claim 5, wherein the tentative drying is performed by radiating with an infrared ray.

8. A wiring pattern, wherein the wiring pattern is manufactured by using the method of forming a wiring pattern according to claim 1.

9. An electronic device, comprising:
   the wiring pattern according to claim 8.

* * * * *